(12) United States Patent
Peng et al.

(10) Patent No.: US 12,315,804 B2
(45) Date of Patent: May 27, 2025

(54) BACK SIDE SIGNAL ROUTING IN A CIRCUIT WITH A RELAY CELL

(71) Applicant: Taiwan Semiconductor Manufacturing Co., Ltd., Hsin-Chu (TW)

(72) Inventors: Shih-Wei Peng, Hsinchu (TW); Wei-Cheng Lin, Taichung (TW); Jiann-Tyng Tzeng, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 992 days.

(21) Appl. No.: 17/230,856

(22) Filed: Apr. 14, 2021

(65) Prior Publication Data
US 2022/0336354 A1  Oct. 20, 2022

(51) Int. Cl.
| H01L 23/528 | (2006.01) |
| H01L 23/48  | (2006.01) |
| H01L 23/485 | (2006.01) |
| H01L 23/522 | (2006.01) |
| H10D 44/45  | (2025.01) |
| H10D 12/01  | (2025.01) |

(52) U.S. Cl.
CPC ........ *H01L 23/5286* (2013.01); *H01L 23/481* (2013.01); *H01L 23/5226* (2013.01)

(58) Field of Classification Search
CPC ............. H01L 23/5286; H01L 23/5226; H01L 23/481; H01L 23/485
See application file for complete search history.

(56) References Cited

U.S. PATENT DOCUMENTS

2020/0395350 A1\* 12/2020 Wu .......................... H01L 24/32

\* cited by examiner

*Primary Examiner* — Antonio B Crite
(74) *Attorney, Agent, or Firm* — Hauptman Ham, LLP

(57) ABSTRACT

Apparatus and methods for back side routing a data signal in a semiconductor device are described. In one example, a described semiconductor cell structure includes: a dummy device region at a front side of the semiconductor cell structure; a metal layer including a plurality of metal lines at a back side of the semiconductor cell structure; a dielectric layer formed between the dummy device region and the metal layer; an inner metal disposed within the dielectric layer; at least one first via that is formed through the dielectric layer and electrically connects the inner metal to the plurality of metal lines at the back side; and at least one second via that is formed in the dielectric layer and physically coupled between the inner metal and the dummy device region at the front side.

20 Claims, 21 Drawing Sheets

600-2

600-3

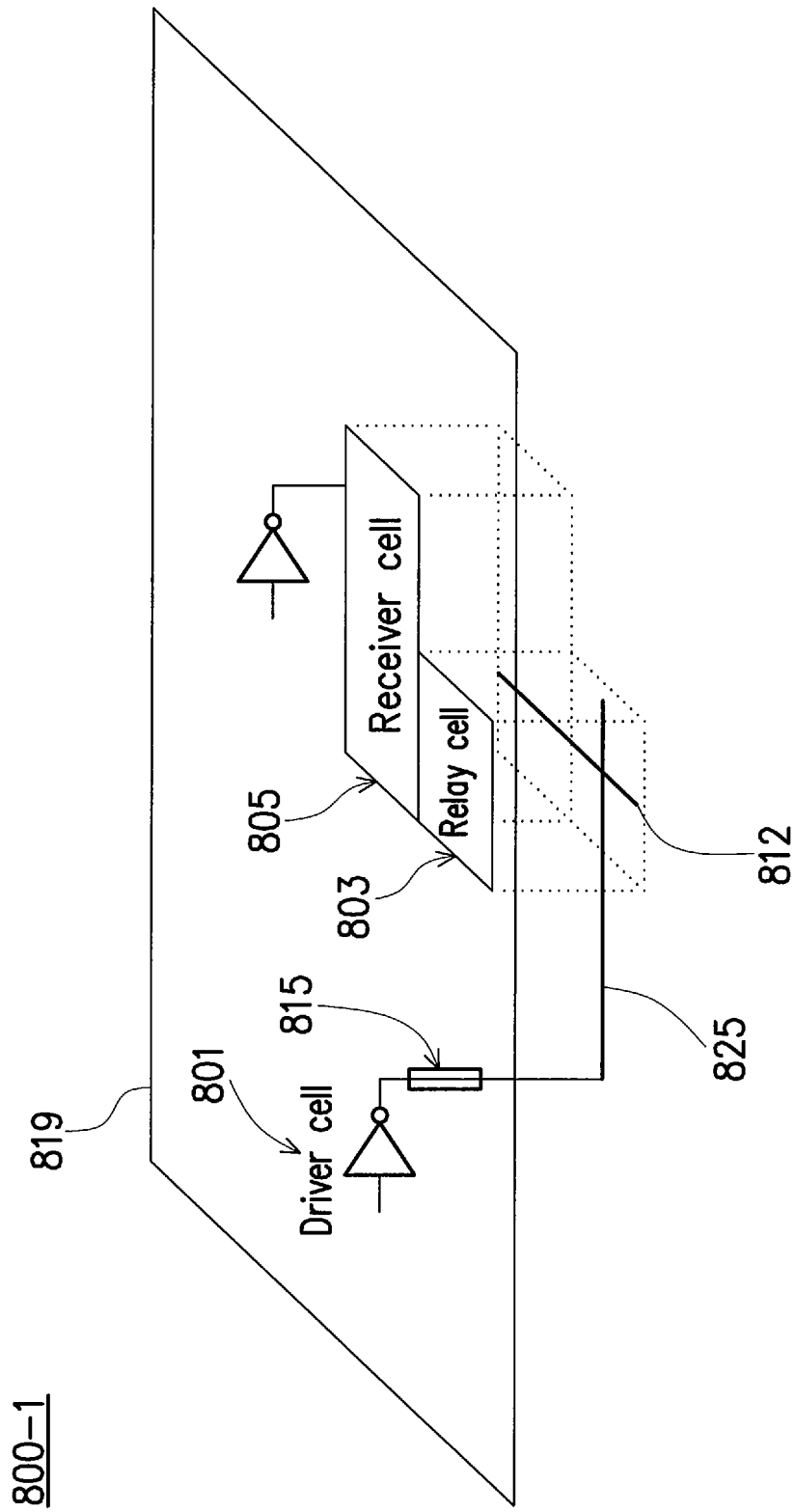

BACK SIDE SIGNAL ROUTING IN A CIRCUIT WITH A RELAY CELL

BACKGROUND

Moore's law illustrates a trend that the number of transistors within a dense integrated circuit (IC) doubles approximately every two years. In addition to becoming denser, overall chip volume (e.g., the amount of physical space a chip occupies) is also decreasing. Packing more transistors into a smaller volume can cause design and fabrication issues, such as lack of pin access or routing congestion on a chip.

Super power rails (SPRs) have been used at a back side of an IC chip to reduce the substrate area and improve routing flexibility. But an SPR for an existing IC is mainly for providing power supply at the back side, rather than routing a data signal between front side and back side of the IC. According to a back side metal analysis, usage of 25% of metal lines at the back side of a typical IC would be enough for a back side power network, which means existing back side techniques have not utilized the back side routing resources to the best.

The information disclosed in this Background section is intended only to provide context for various embodiments of the invention described below and, therefore, this Background section may include information that is not necessarily prior art information (i.e., information that is already known to a person of ordinary skill in the art). Thus, work of the presently named inventors, to the extent the work is described in this background section, as well as aspects of the description that may not otherwise qualify as prior art at the time of filing, are neither expressly nor impliedly admitted as prior art against the present disclosure.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

FIG. 8A illustrates a perspective view of an exemplary back side signal routing from a driver cell to a receiver cell, in accordance with some embodiments of the present disclosure.

DETAILED DESCRIPTION OF EXEMPLARY EMBODIMENTS

Figure 1:
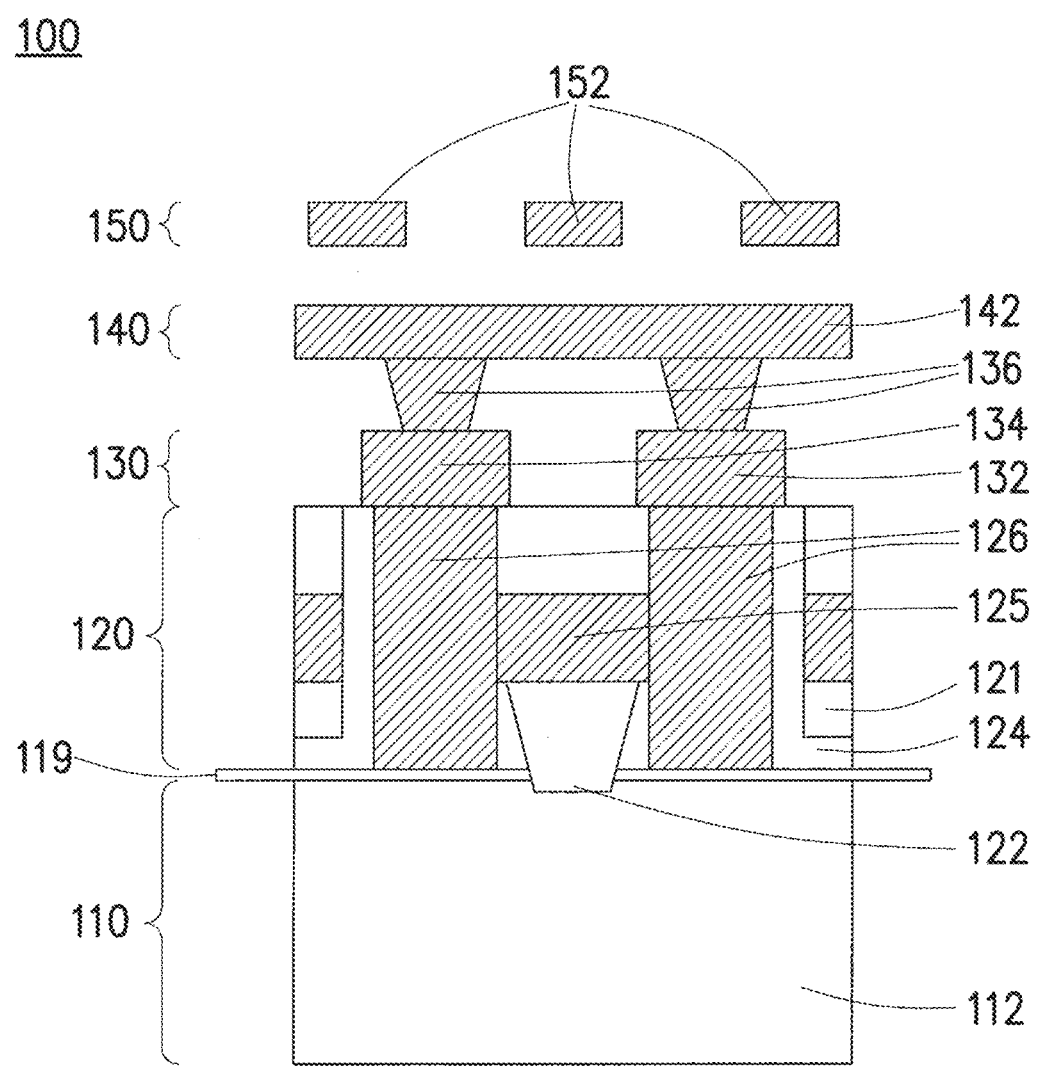
FIG. 1 illustrates a cross sectional view of an exemplary semiconductor cell structure, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

To reduce the layer number and chip area, the present teaching discloses a relay cell structure in an IC to route a signal, whether it carries data or power, on the back side of the IC using metal layers including backside metal 0 (BM0) lines, backside metal 1 (BM1) lines, and/or an inner metal at the back side. In some embodiments, the relay cell structure includes: a first connection between the inner metal and other back side layers, a second connection between the inner metal and a front side gate. Each of the first connection and the second connection can be built according to different patterns in different embodiments.

In some embodiments, a signal can be passed from a driver cell to the relay cell through: the inner metal, the BM0 lines, the BM1 lines, and/or another relay cell. In some embodiments, a poly line extension can be used to pass the signal from the relay cell to a receiver cell located adjacent to the relay cell. In some embodiments, the signal can be passed from the relay cell to a receiver cell through: a via feeding through the back side and front side, an epitaxial layer at the front side of relay cell, and front side routing.

FIG. 1 illustrates a cross sectional view of an exemplary semiconductor cell structure 100, in accordance with some embodiments of the present disclosure. As shown in FIG. 1, the exemplary semiconductor cell structure 100 includes: a dummy device region 110 at a front side of the semiconductor cell structure 100; a backside metal 0 (BM0) layer 130 including a plurality of metal lines 132, 134 at a back side of the semiconductor cell structure 100; and a dielectric layer 120 formed between the dummy device region 110 and the BM0 layer 130. A front side herein refers to portions of the semiconductor cell structure 100 that are located below the surface 119 along the Z direction in FIG. 1; while a back side herein refers to portions of the semiconductor cell structure 100 that are located above the surface 119 along the Z direction in FIG. 1. As such, in the semiconductor cell structure 100 shown in FIG. 1, merely the dummy device region 110 is located at the front side, while all other portions in FIG. 1 are located at the back side. While FIG. 1 is for illustration only, other components (not shown) can be located at the front side and/or back side without going beyond the scope of the present teaching.

As shown in FIG. 1, the semiconductor cell structure 100 further includes an inner metal 125 disposed within the dielectric layer 120. The inner metal 125 extends along the X direction, and can comprise a metal or metal compound. In some embodiments, the metal or metal compound includes Ti, Ta, W, Al, Cu, Mo, Pt, TiN, TaN, TaC, TaSiN, WN, MoN, MoON, RuO$_2$, TiAl, TiAlN, TaCN, a combination thereof or another suitable material.

The semiconductor cell structure 100 further includes: two first vias 126 disposed respectively at two sides of the inner metal 125 along the X direction; and a second via 122 that is formed in the dielectric layer 120 and physically coupled between the inner metal 125 and the dummy device region 110 at the front side. Each of the two first vias 126 extends through the dielectric layer 120 along the Y direction and electrically connects the inner metal 125 to a respective one of the plurality of BM0 lines 132, 134 at the back side. In some embodiments, the semiconductor cell structure 100 may merely include one of the two first vias 126 to electrically connect the inner metal 125 to one of the plurality of BM0 lines 132, 134 at the back side. In some embodiments, the semiconductor cell structure 100 may include multiple second vias 122 to electrically connect the inner metal 125 to the dummy device region 110. The dummy device region 110 may include a metal or metal compound 112 to serve as a dummy gate. That is, the dummy device region 110 in this example does not work as a transistor gate, but can help to pass signal between the front side and the back side, e.g. through the via 122.

In the example shown in FIG. 1, the semiconductor cell structure 100 further includes a backside metal 1 (BM1) layer 140 including a plurality of metal lines 142 on the BM0 layer 130 along the Z direction; and a backside metal 2 (BM2) layer 150 including a plurality of metal lines 152 on the BM1 layer 140 along the Z direction. A metal 1 line 142 may be electrically connected to the metal 0 lines 134, 132 by the vias 136.

In some embodiments, each of the vias 122, 126, 136, the dummy gate 112, and the metal lines 132, 134, 142, 152 may include a metal or metal compound. In some embodiments, the metal or metal compound includes Ti, Ta, W, Al, Cu, Mo, Pt, TiN, TaN, TaC, TaSiN, WN, MoN, MoON, RuO$_2$, TiAl, TiAlN, TaCN, a combination thereof or another suitable material. In some embodiments, the dielectric layer 120 may include a dielectric material 121 such as silicon oxide, silicon nitride, silicon oxynitride, high-k material (e.g., hafnium oxide (HfOx), zirconium oxide (ZrOx) or aluminum oxide (Al$_2$O$_3$)) or another suitable insulating material. In some embodiments, the dielectric layer 120 may be replaced by a semiconductor layer comprising a semiconductor material 121. The dielectric layer 120 may also include an etch stop layer or isolation layer 124 comprising a dielectric material around the vias 122, 126.

Figure 2:
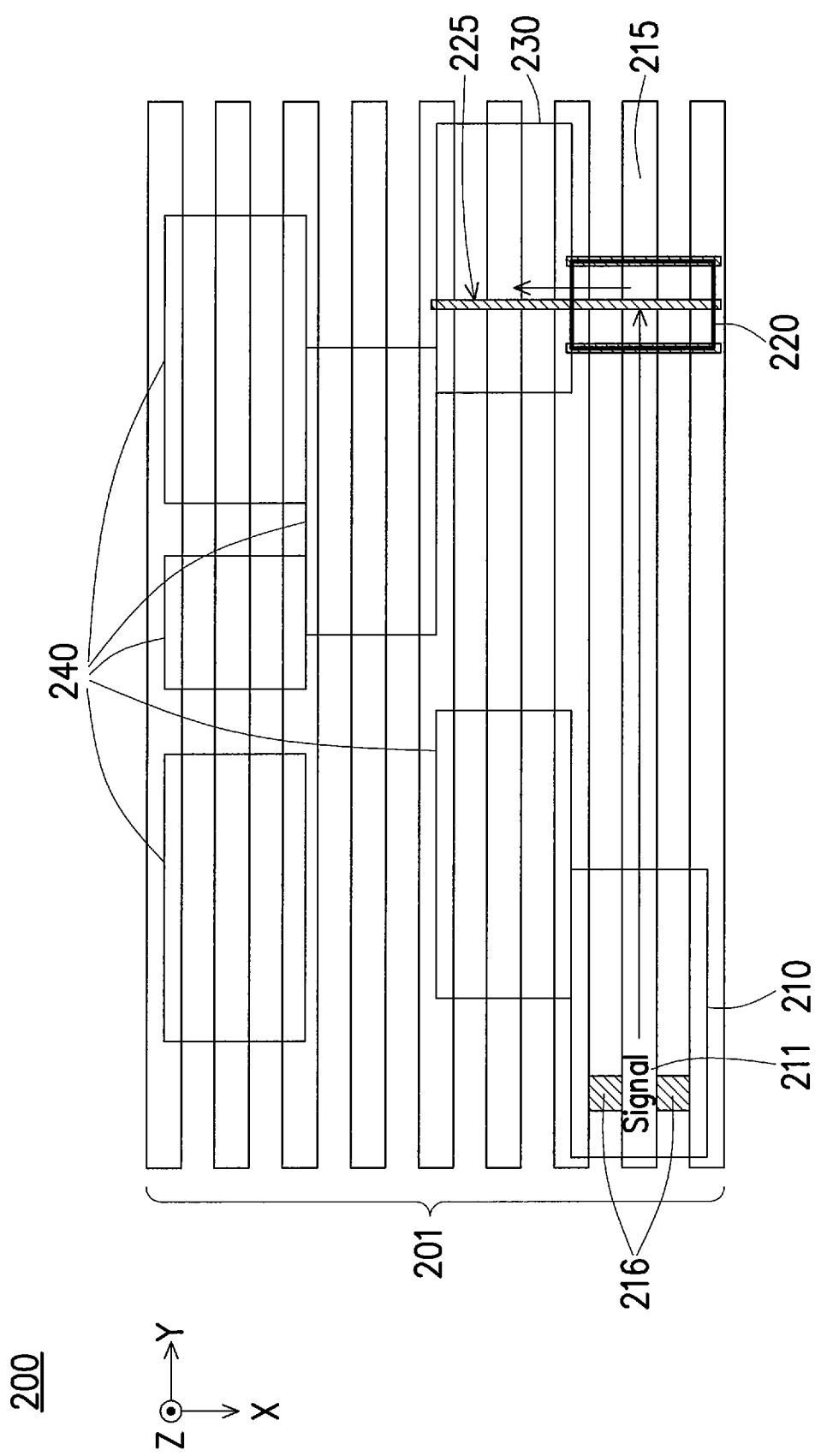
FIG. 2 illustrates an exemplary method for routing a signal by a relay cell in a circuit, in accordance with some embodiments of the present disclosure.

FIG. 2 illustrates an exemplary method for routing a signal by a relay cell 220 in a circuit 200, in accordance with some embodiments of the present disclosure. As shown in FIG. 2, the circuit 200 includes: a plurality of cells 210, 220, 230, 240; and a plurality of inner metals 201 extending through the plurality of cells 210, 220, 230, 240. The cells in one circuit have consistent front sides and consistent back sides. As such, a front or back side of any cell in the circuit 200 can also be called a front or back side of the circuit 200.

In some embodiments, a driver cell 210 in the circuit 200 is configured for generating a signal 211; and a receiver cell 230 in the circuit 200 is configured for receiving the signal 211, through a relay cell 220 located next to the receiver cell 230. For example, the signal 211 may be a data signal generated by a transistor in a device region at a front side of the driver cell 210, and passed to the inner metal 215 by vias 216. Since the inner metal 215 extends into both the driver cell 210 and the relay cell 220, the data signal 211 is passed from the driver cell 210 to the relay cell 220 at the back side of the circuit 200 through the inner metal 215.

In some embodiments, the relay cell 220 may have a structure similar to that of the semiconductor cell structure 100 shown in FIG. 1. The relay cell 220 can relay the signal 211 from the driver cell 210 to the receiver cell 230 through a signal line 225 that extends into both the receiver cell 230 and the relay cell 220. In some embodiments, the signal line 225 comprises two portions: an active gate in the receiver cell 230 at a front side of the circuit 200, and a dummy gate in the relay cell 220 at the front side of the circuit 200. By an extension of the signal line 225, the data signal 211 is then forwarded by the relay cell 220 to the receiver cell 230.

Figure 3A:
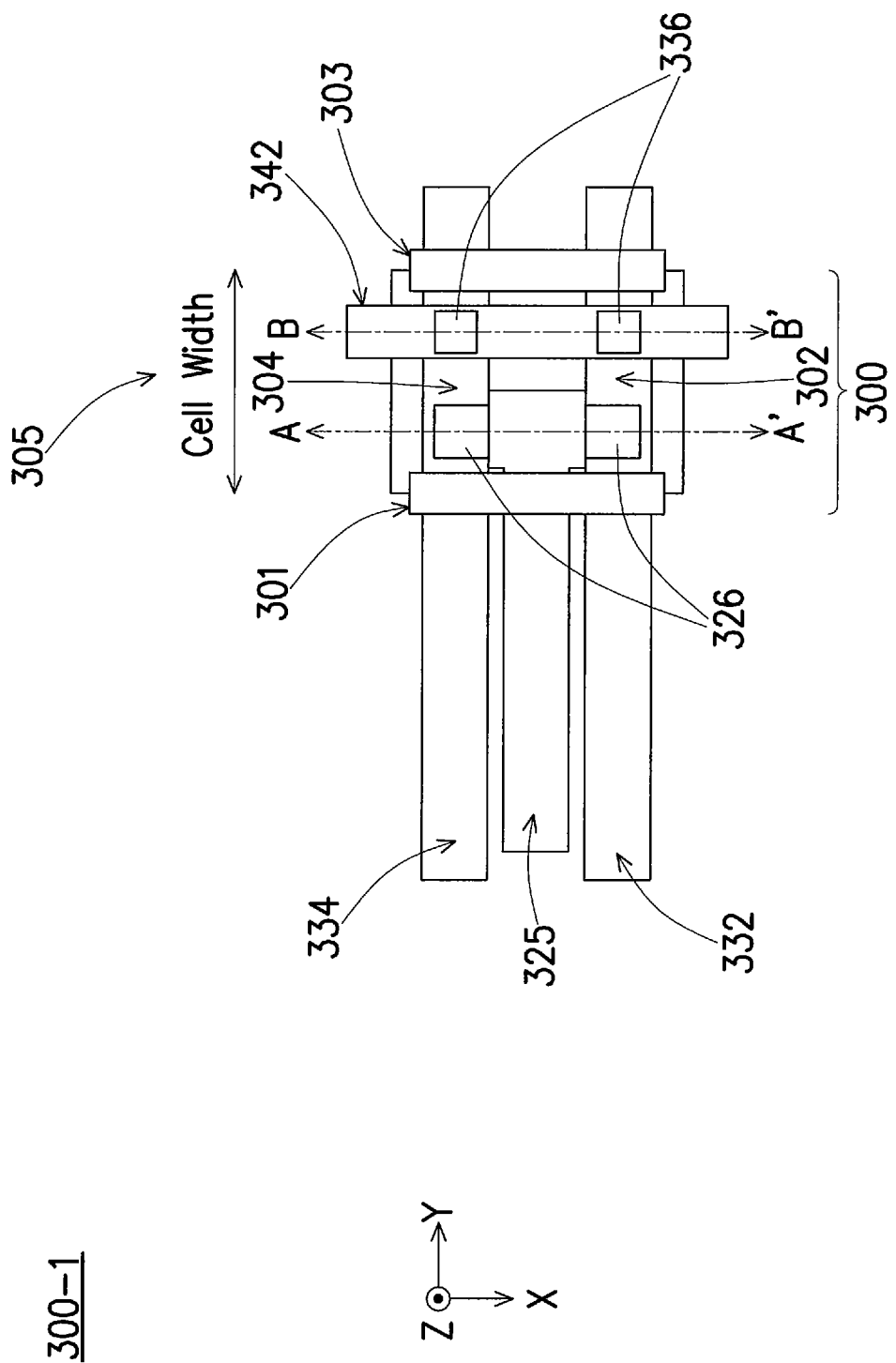
FIG. 3A illustrates an exemplary layout of a relay cell including a connection between an inner metal and a back side layer, in accordance with some embodiments of the present disclosure.
Figure 3B:
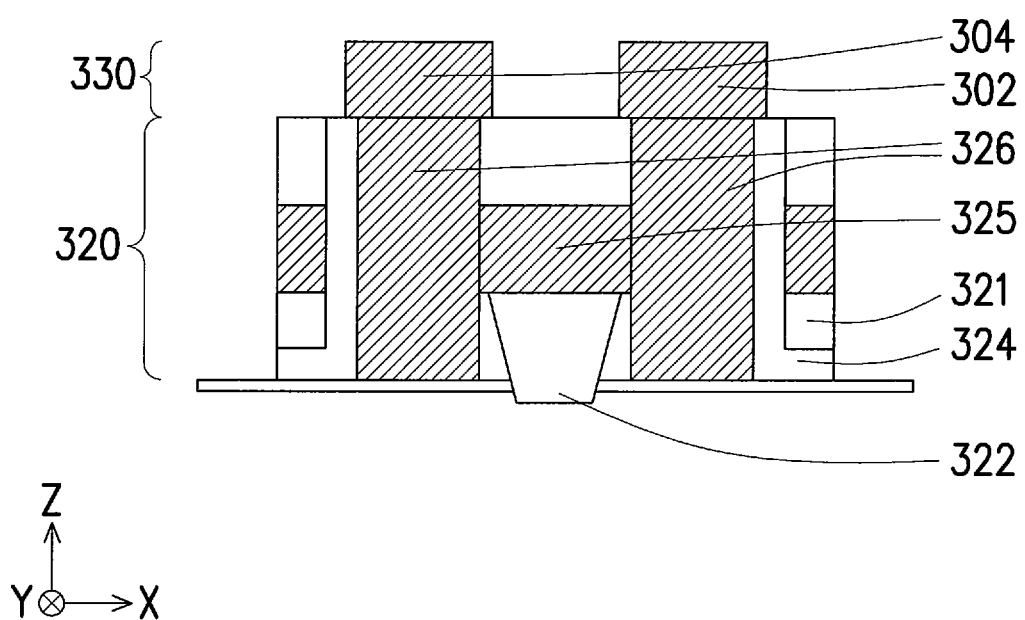
FIG. 3B illustrates a first cross sectional view of the relay cell in FIG. 3A, in accordance with some embodiments of the present disclosure.
Figure 3C:
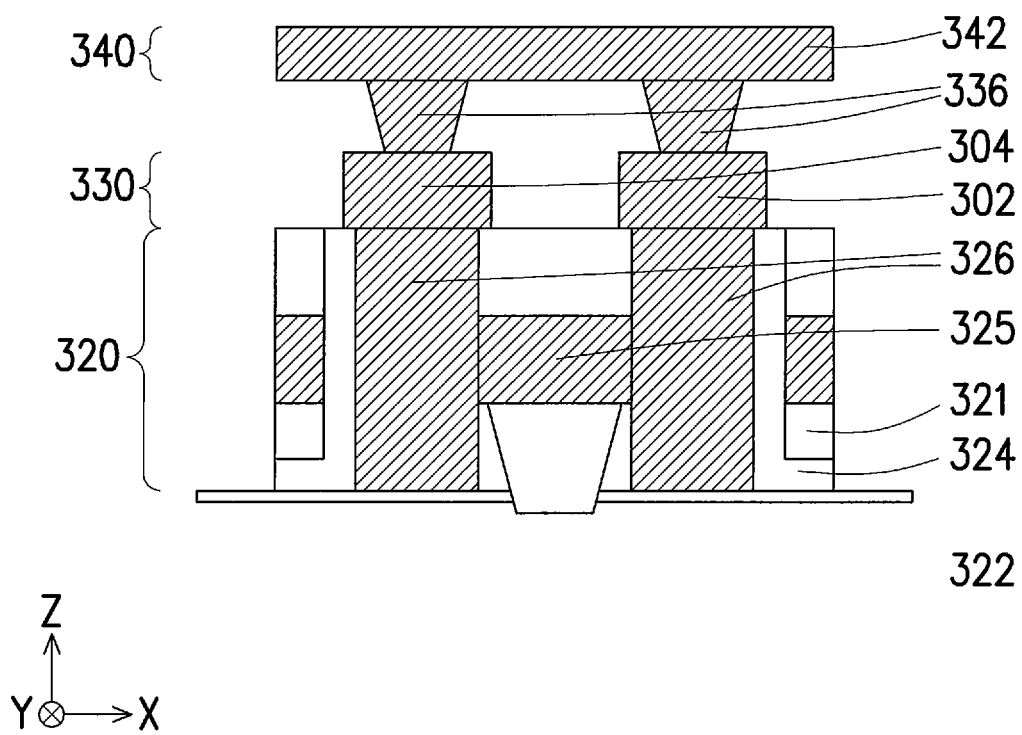
FIG. 3C illustrates a second cross sectional view of the relay cell in FIG. 3A, in accordance with some embodiments of the present disclosure.

FIG. 3A illustrates an exemplary back side layout 300-1 of a relay cell 300 including a connection between an inner metal and a back side layer, in accordance with some embodiments of the present disclosure. FIG. 3B illustrates a first cross sectional view 300-2 of the relay cell 300 along the line A-A' in FIG. 3A, in accordance with some embodiments of the present disclosure. FIG. 3C illustrates a second cross sectional view 300-3 of the relay cell 300 along the line B-B' in FIG. 3A, in accordance with some embodiments of the present disclosure. In some embodiments, the relay cell 300 may have a structure similar to that of the semiconductor cell structure 100 shown in FIG. 1.

As shown in FIG. 3A, the relay cell 300 includes two dielectric regions 301, 303 disposed respectively at two boundaries of the relay cell 300 along the Y direction. Each of the two dielectric regions 301, 303 may include a dielectric material such as silicon oxide, silicon nitride, silicon oxynitride, high-k material (e.g., hafnium oxide (HfOx), zirconium oxide (ZrOx) or aluminum oxide ($Al_2O_3$)) or another suitable insulating material. As such, two BM0 lines 302, 304 in the relay cell 300 are electrically isolated by the two dielectric regions 301, 303 from BM0 lines 332, 334 outside the relay cell 300. In some embodiments, each of the two BM0 lines 332, 334 is a power rail to provide a power supply. For example, the BM0 line 332 provides a negative power supply (VSS) and the BM0 line 334 provides a positive power supply (VDD); or the BM0 line 334 provides a negative power supply (VSS) and the BM0 line 332 provides a positive power supply (VDD). As shown in FIG. 3A, the relay cell 300 has a cell width 305 along the Y direction. In some embodiments, the cell width 305 is equal to at least two contacted poly pitches (CPPs).

The relay cell 300 further includes an inner metal 325, which is electrically connected to the BM0 lines 302, 304 by a connection 326. As shown in FIG. 3B, the connection 326 includes one or more vias located beside the inner metal 325 in the relay cell 300. The BM0 lines 302, 304 may be electrically connected to the BM1 line 342 through vias 336, as shown in FIG. 3C. Other components in FIG. 3B, FIG. 3C are similar to those in FIG. 1, and can be referred to previous descriptions regarding FIG. 1. In some embodiments, a signal may be passed from the inner metal 325, to the vias 326, to the BM0 lines 302, 304, to the vias 336, then to the BM1 line 342, all at the back side of the relay cell 300.

Figure 4:
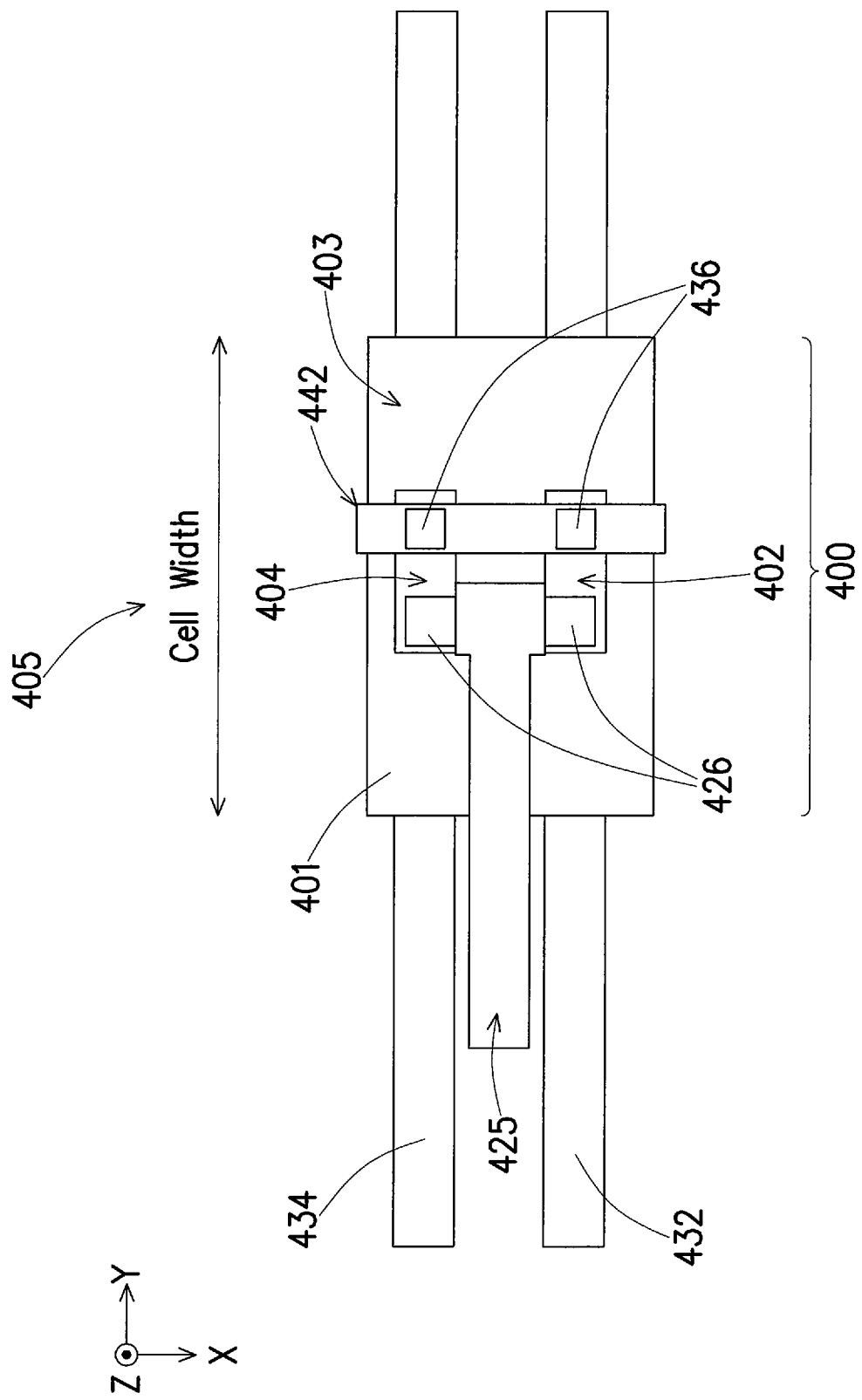
FIG. 4 illustrates an exemplary layout of another relay cell including a connection between an inner metal and a back side layer, in accordance with some embodiments of the present disclosure.

FIG. 4 illustrates an exemplary layout of another relay cell 400 including a connection between an inner metal and a back side layer, in accordance with some embodiments of the present disclosure. In some embodiments, the relay cell 400 may have a structure similar to that of the semiconductor cell structure 100 shown in FIG. 1. Different from the relay cell 300 in FIGS. 3A-3C, the relay cell 400 in FIG. 4 includes two empty space regions 401, 403 disposed respectively at two boundaries of the relay cell 400 along the Y direction. Each of the two empty space regions 401, 403 may include a natural end-to-end space. As such, two BM0 lines 402, 404 in the relay cell 400 are electrically isolated by the two empty space regions 401, 403 from BM0 lines 432, 434 outside the relay cell 400. In some embodiments, each of the two BM0 lines 432, 434 is a power rail to provide a power supply. For example, the BM0 line 432 provides a negative power supply (VSS) and the BM0 line 434 provides a positive power supply (VDD); or the BM0 line 434 provides a negative power supply (VSS) and the BM0 line 432 provides a positive power supply (VDD). As shown in FIG. 4, the relay cell 400 has a cell width 405 along the Y direction. In some embodiments, the cell width 405 is equal to at least a sum of: a minimum length of a metal 0 line, plus twice an end-to-end space distance. Other components in FIG. 4 are similar to those in FIG. 3A, and can be referred to previous descriptions regarding FIG. 3A.

Figure 5A:
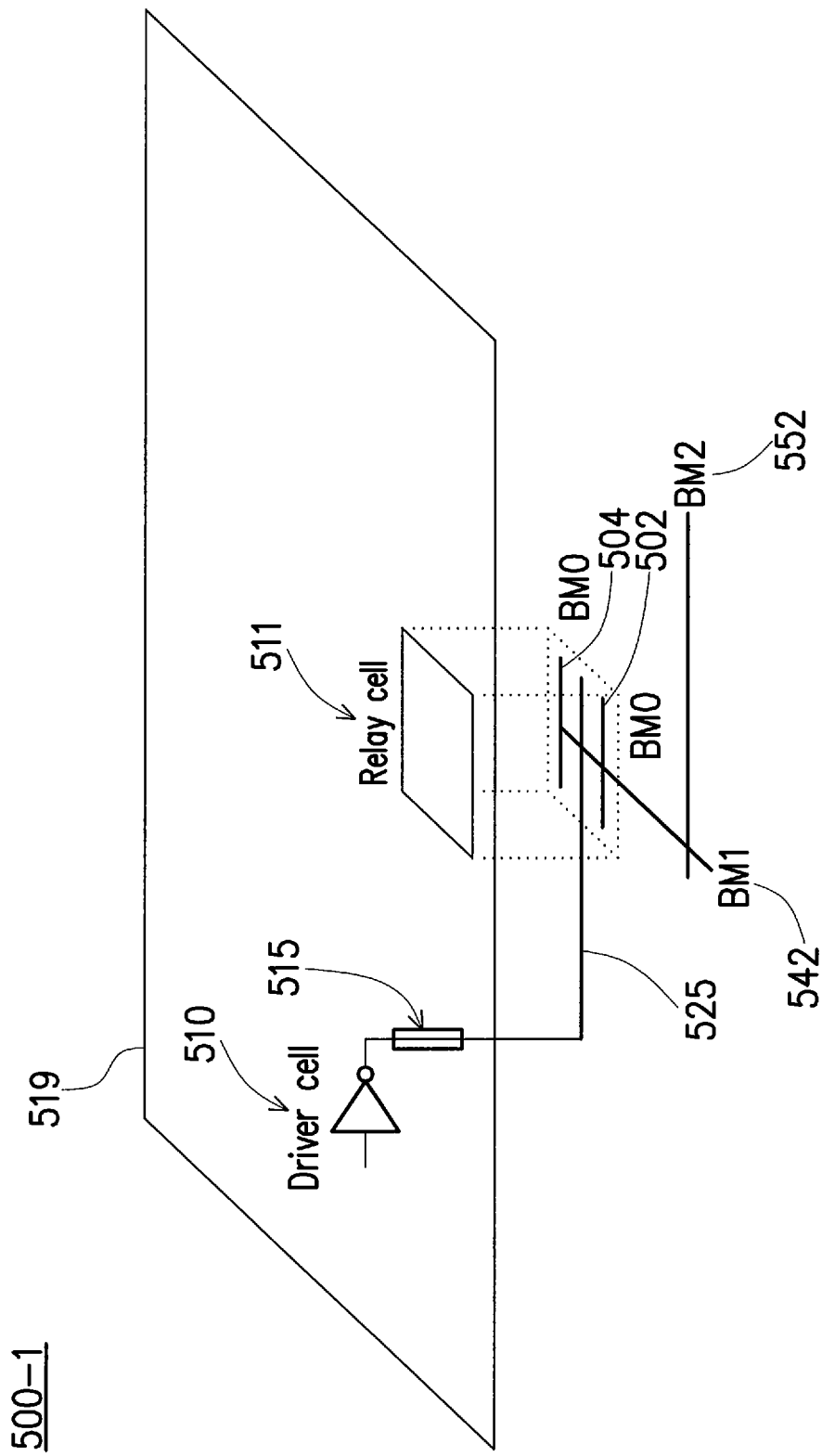
FIG. 5A illustrates a perspective view of an exemplary back side signal routing from a driver cell to a relay cell, in accordance with some embodiments of the present disclosure.

FIG. 5A illustrates a perspective view 500-1 of an exemplary back side signal routing from a driver cell 510 to a relay cell 511 in a circuit, in accordance with some embodiments of the present disclosure. As shown in FIG. 5A, the driver cell 510 may include a transistor to generate a data signal at the front side (above the surface 519 in FIG. 5A) of the driver cell 510. The driver cell 510 may include a via 515 going through the surface 519 to pass the data signal from the transistor at the front side of the driver cell 510 to an inner metal 525 at the back side of the driver cell 510.

Figure 5B:
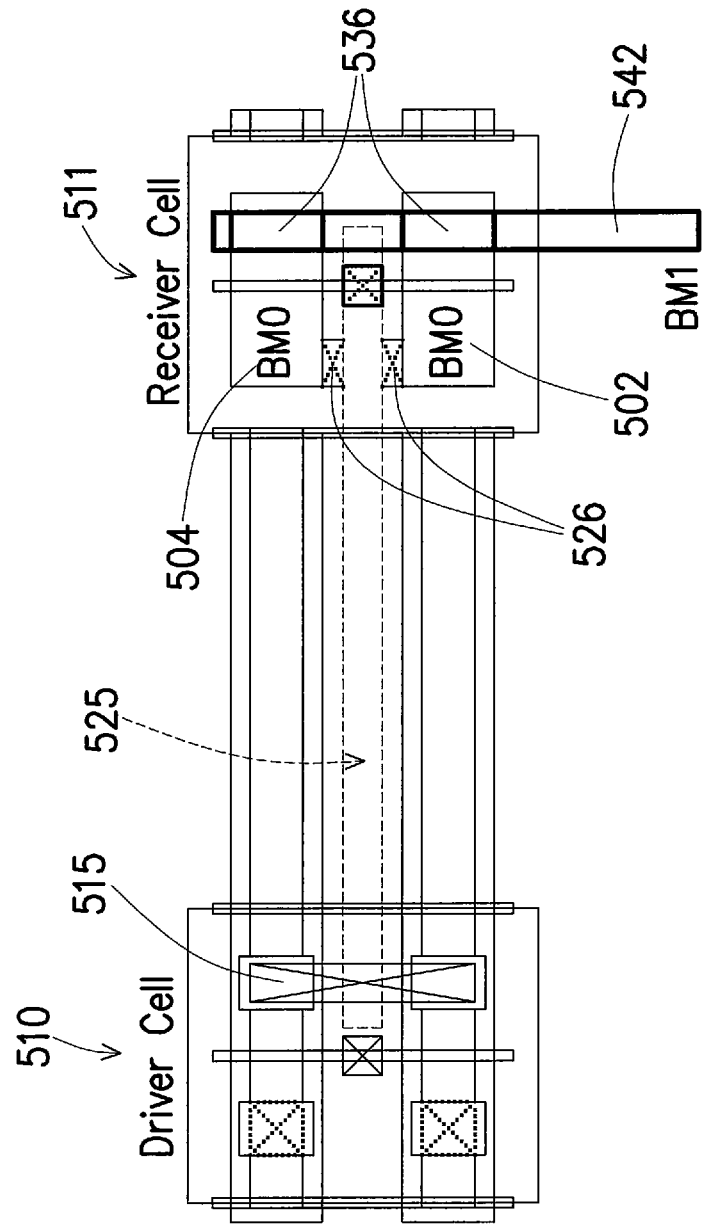
FIG. 5B illustrates a top view of the exemplary back side signal routing in FIG. 5A, in accordance with some embodiments of the present disclosure.

FIG. 5B illustrates a top view 500-2 of the exemplary back side signal routing in FIG. 5A, in accordance with some embodiments of the present disclosure. As shown in FIG. 5A and FIG. 5B, the inner metal 525 extends into both the driver cell 510 and the relay cell 511, to electrically connect the driver cell 510 and the relay cell 511. As such, the data signal can be received by the relay cell 511 through the inner metal 525. In some embodiments, the relay cell 511 may have a structure similar to that of the semiconductor cell structure 100 shown in FIG. 1, the relay cell 300 in FIGS. 3A-3C, and/or the relay cell 400 in FIG. 4. The relay cell 511 may forward the data signal to a receiver cell (not shown in FIG. 5A) at the back side through: the inner metal 525, the BM0 lines 502, 504, the BM1 line 542, and the BM2 line 552. To be specific, the data signal may be passed from the inner metal 525 to the BM0 lines 502, 504, through the vias 526 disposed at two sides of the inner metal 525 respectively; the data signal may then be passed from the BM0 lines 502, 504 to the BM1 line 542, through the vias 536 coupled between the BM0 lines 502, 504 and the BM1 line 542.

Figure 6A:
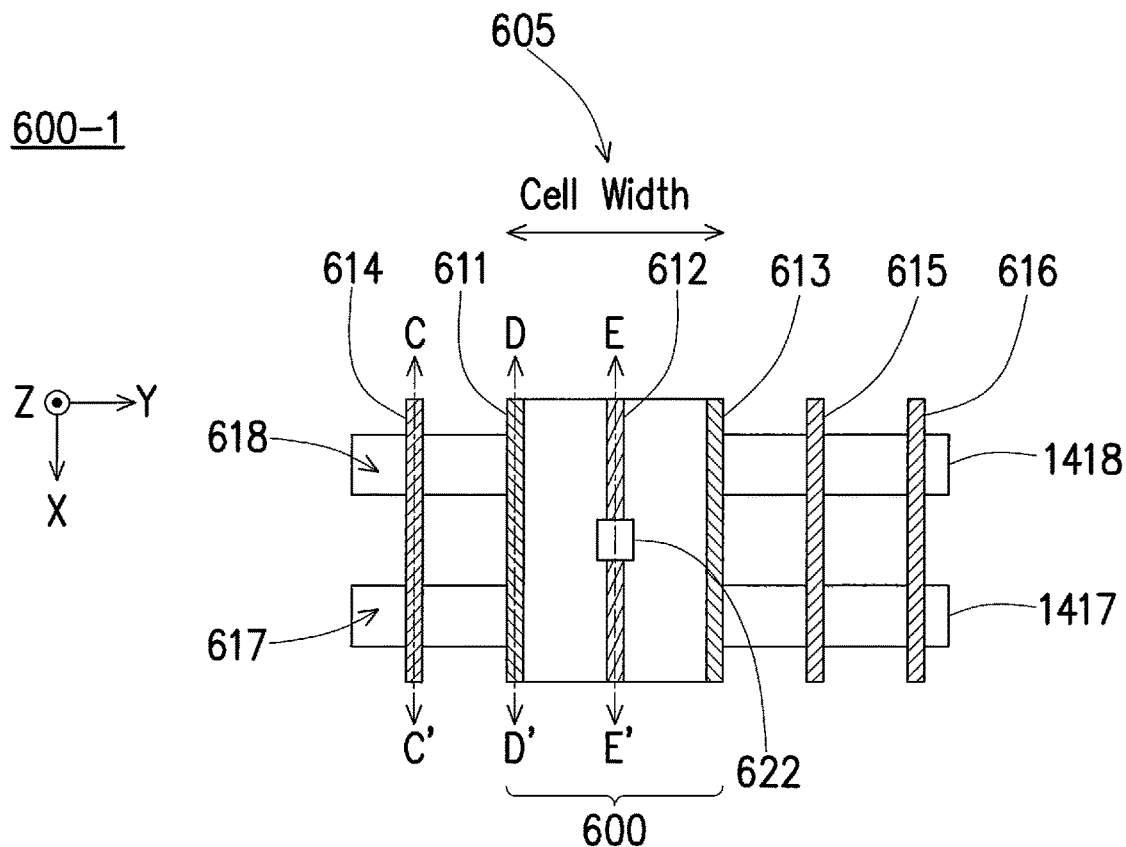
FIG. 6A illustrates an exemplary layout of a relay cell including a connection between an inner metal and a front side layer, in accordance with some embodiments of the present disclosure.
Figure 6B:
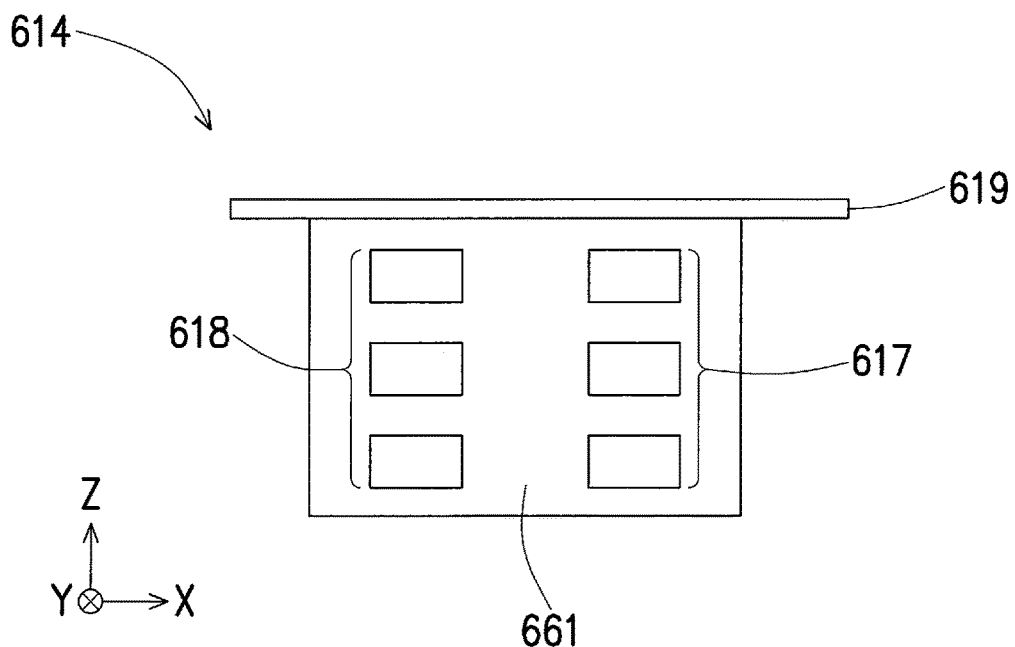
FIG. 6B illustrates a cross sectional view of an active gate in FIG. 6A, in accordance with some embodiments of the present disclosure.
Figure 6C:
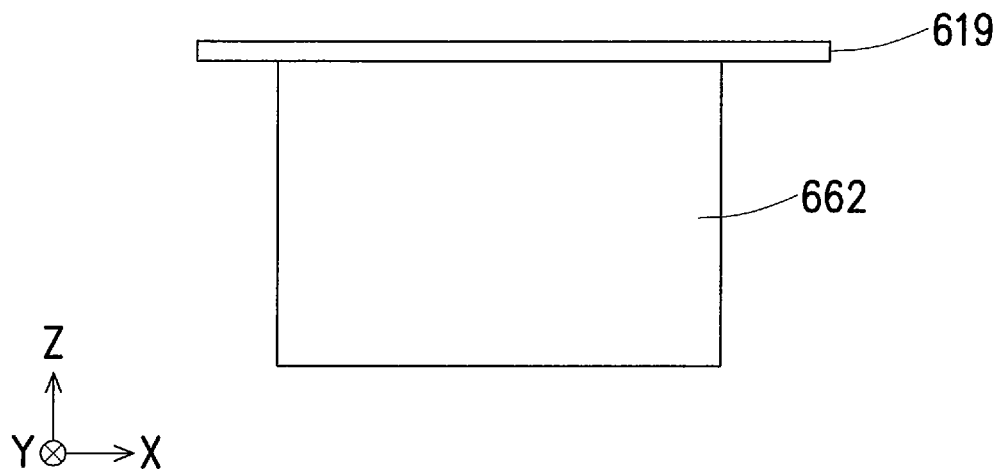
FIG. 6C illustrates a first cross sectional view of the relay cell in FIG. 6A, in accordance with some embodiments of the present disclosure.

FIG. 6A illustrates an exemplary front side layout 600-1 of a relay cell 600 including a connection between an inner metal and a front side layer, in accordance with some embodiments of the present disclosure. FIG. 6B illustrates a cross sectional view of an active gate 614 along the line C-C' in FIG. 6A, in accordance with some embodiments of the present disclosure. FIG. 6C illustrates a first cross sectional view 600-2 of the relay cell 600 along the line D-D' in FIG.

Figure 6D:
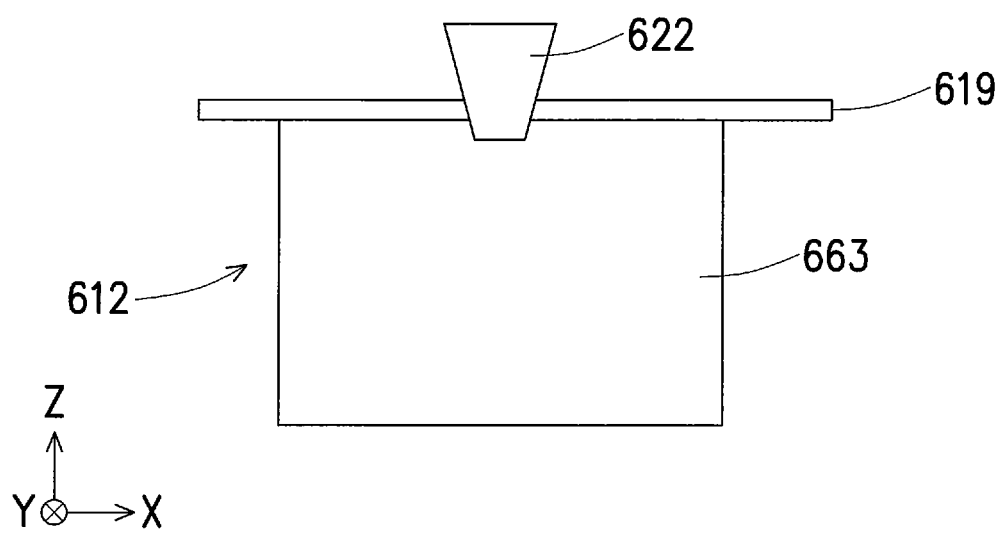
FIG. 6D illustrates a second cross sectional view of the relay cell in FIG. 6A, in accordance with some embodiments of the present disclosure.

6A, in accordance with some embodiments of the present disclosure. FIG. 6D illustrates a second cross sectional view 600-3 of the relay cell 600 along the line E-E' in FIG. 6A, in accordance with some embodiments of the present disclosure. In some embodiments, the relay cell 600 may have a structure similar to that of the semiconductor cell structure 100 shown in FIG. 1.

As shown in FIG. 6A, the relay cell 600 resides over two device structures 617, 618, each of which is an active zone surrounded by polysilicon gates 614, 615, 616. In different embodiments, each of the two device structures 617, 618 may have a fin structure, a gate-all-around structure, or a nano-sheet structure. In some embodiments, one of the two device structures 617, 618 may serve as a p-type channel for a metal-oxide-semiconductor field-effect transistor (MOSFET); and the other one of the two device structures 617, 618 may serve as an n-type channel for a MOSFET. As shown in FIG. 6B, the gate 614, at the front side below the surface 619 along the Z direction, is an active gate including polysilicon 661 surrounding the channels 617, 618, each of which may include a plurality of nanowires.

As shown in FIG. 6A, the relay cell 600 is formed by cutting the two device structures 617, 618 and removing three polysilicon gates on the device structures 617, 618. Then, two of the three removed polysilicon gates are replaced by two boundary dummy gates 611, 613 located respectively at two boundaries of the relay cell 600 along the Y direction; and the remaining one of the three removed polysilicon gates is replaced by a middle dummy gate 612 located between the two boundary dummy gates 611, 613 along the Y direction.

As shown in FIG. 6C, in some embodiments, each of the two boundary dummy gates 611, 613 at the front side (below the surface 619 along the Z direction) of the relay cell 600 may comprise a dielectric material 662, which may be e.g. silicon oxide, silicon nitride, silicon oxynitride, high-k material (e.g., hafnium oxide (HfOx), zirconium oxide (ZrOx) or aluminum oxide ($Al_2O_3$)) or another suitable insulating material.

As shown in FIG. 6D, in some embodiments, the middle dummy gate 612 comprises a metal or metal compound 663, which may include e.g. Ti, Ta, W, Al, Cu, Mo, Pt, TiN, TaN, TaC, TaSiN, WN, MoN, MoON, $RuO_2$, TiAl, TiAlN, TaCN, a combination thereof or another suitable material. The relay cell 600 may include a via 622 extending along the Z direction through the surface 619 to electrically connect the middle dummy gate 612 at the front side of the relay cell 600 to the back side, e.g. an inner metal, of the relay cell 600.

In some embodiments, the middle dummy gate 612 and the two boundary dummy gates 611, 613 together may be referred to as a dummy device region of the relay cell 600, because this dummy device region does not include any gate controlling a transistor, but can pass signal between front side and back side, and to another cell by line extension of the middle dummy gate 612. As shown in FIG. 6A, the relay cell 600 has a cell width 605 along the Y direction. In some embodiments, the cell width 605 is equal to at least two contacted poly pitches (CPPs).

Figure 7:
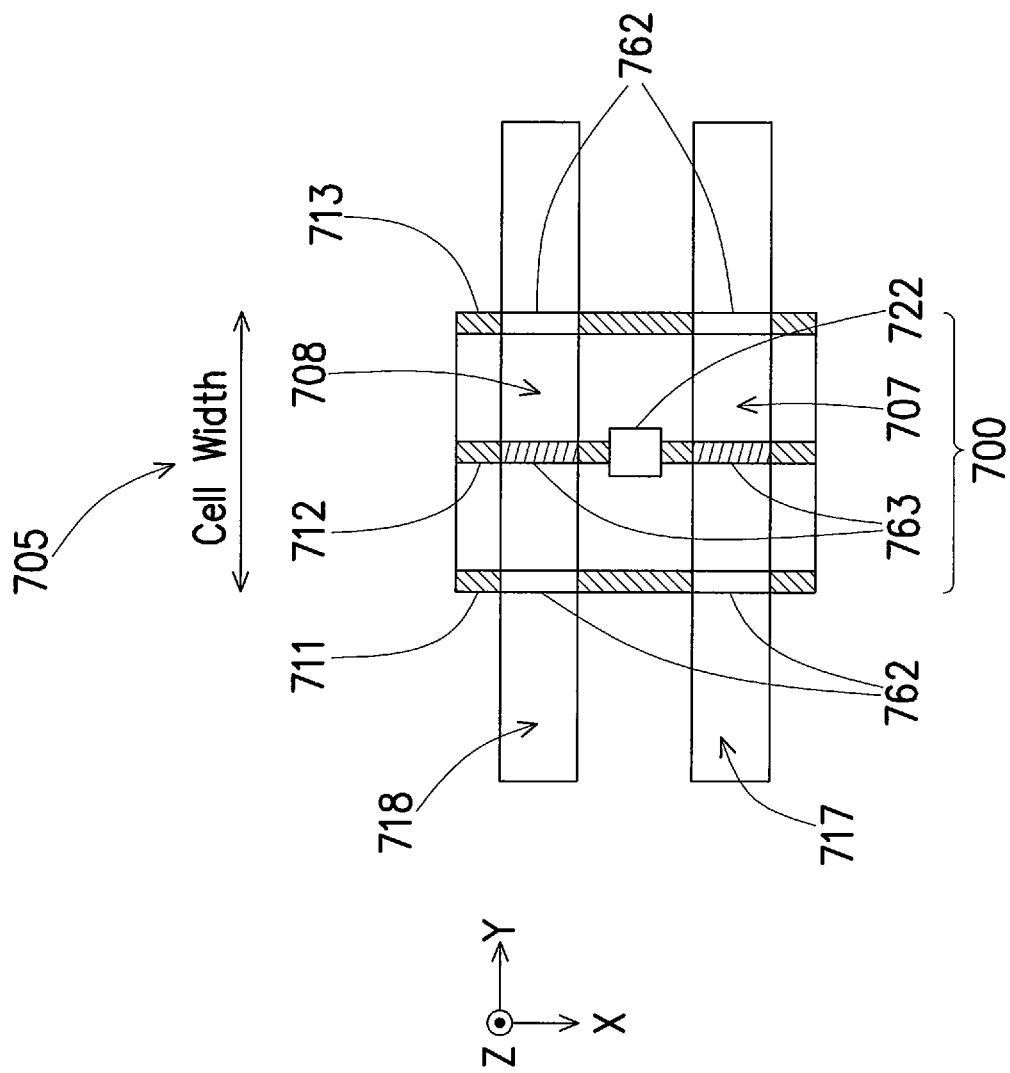
FIG. 7 illustrates an exemplary layout of another relay cell including a connection between an inner metal and a front side layer, in accordance with some embodiments of the present disclosure.

FIG. 7 illustrates an exemplary layout of another relay cell 700 including a connection between an inner metal and a front side layer, in accordance with some embodiments of the present disclosure. In some embodiments, the relay cell 700 may have a structure similar to that of the semiconductor cell structure 100 shown in FIG. 1.

As shown in FIG. 7, the relay cell 700 resides over two device structures 717, 718, each of which is an active zone surrounded by polysilicon gates 711, 712, 713. Different from the relay cell 600 in FIGS. 6A-6D, the relay cell 700 in FIG. 7 is formed with isolations 762 at the two boundary dummy gates 711, 713 located respectively at two boundaries of the relay cell 700 along the Y direction, where two device structures 707, 708 continue within the relay cell 700 and are isolated from active zones 717, 718 outside the relay cell 700 by the two boundary dummy gates 711, 713. In some embodiments, each of isolations 762 may be a c-polysilicon at oxide-definition edge (CPODE) isolation. The relay cell 700 in FIG. 7 also includes a middle dummy gate 712 located between the two boundary dummy gates 711, 713 along the Y direction, where the middle dummy gate 712 comprises metal portions 763, which includes a metal or metal compound, e.g. Ti, Ta, W, Al, Cu, Mo, Pt, TiN, TaN, TaC, TaSiN, WN, MoN, MoON, $RuO_2$, TiAl, TiAlN, TaCN, a combination thereof or another suitable material. The relay cell 700 may include a via 722 extending along the Z direction to electrically connect the middle dummy gate 712 at the front side of the relay cell 700 to the back side, e.g. an inner metal, of the relay cell 700.

In some embodiments, the middle dummy gate 712 and the two boundary dummy gates 711, 713 together may be referred to as a dummy device region of the relay cell 700, because this dummy device region does not include any gate functioning to control a transistor, but can pass signal between front side and back side, and/or to another cell by line extension of the middle dummy gate 712. As shown in FIG. 7, the relay cell 700 has a cell width 705 along the Y direction. In some embodiments, the cell width 705 is equal to at least two contacted poly pitches (CPPs).

FIG. 8A illustrates a perspective view 800-1 of an exemplary back side signal routing from a driver cell 801 to a receiver cell 805 in a circuit, through a relay cell 803 located next to the receiver cell 805, in accordance with some embodiments of the present disclosure. As shown in FIG. 8A, the driver cell 801 may include a transistor to generate a data signal at the front side (above the surface 819 in FIG. 8A) of the driver cell 801. The driver cell 801 may include a via 815 going through the surface 819 to pass the data signal from the transistor at the front side of the driver cell 801 to an inner metal 825 at the back side of the driver cell 801.

Figure 8B:
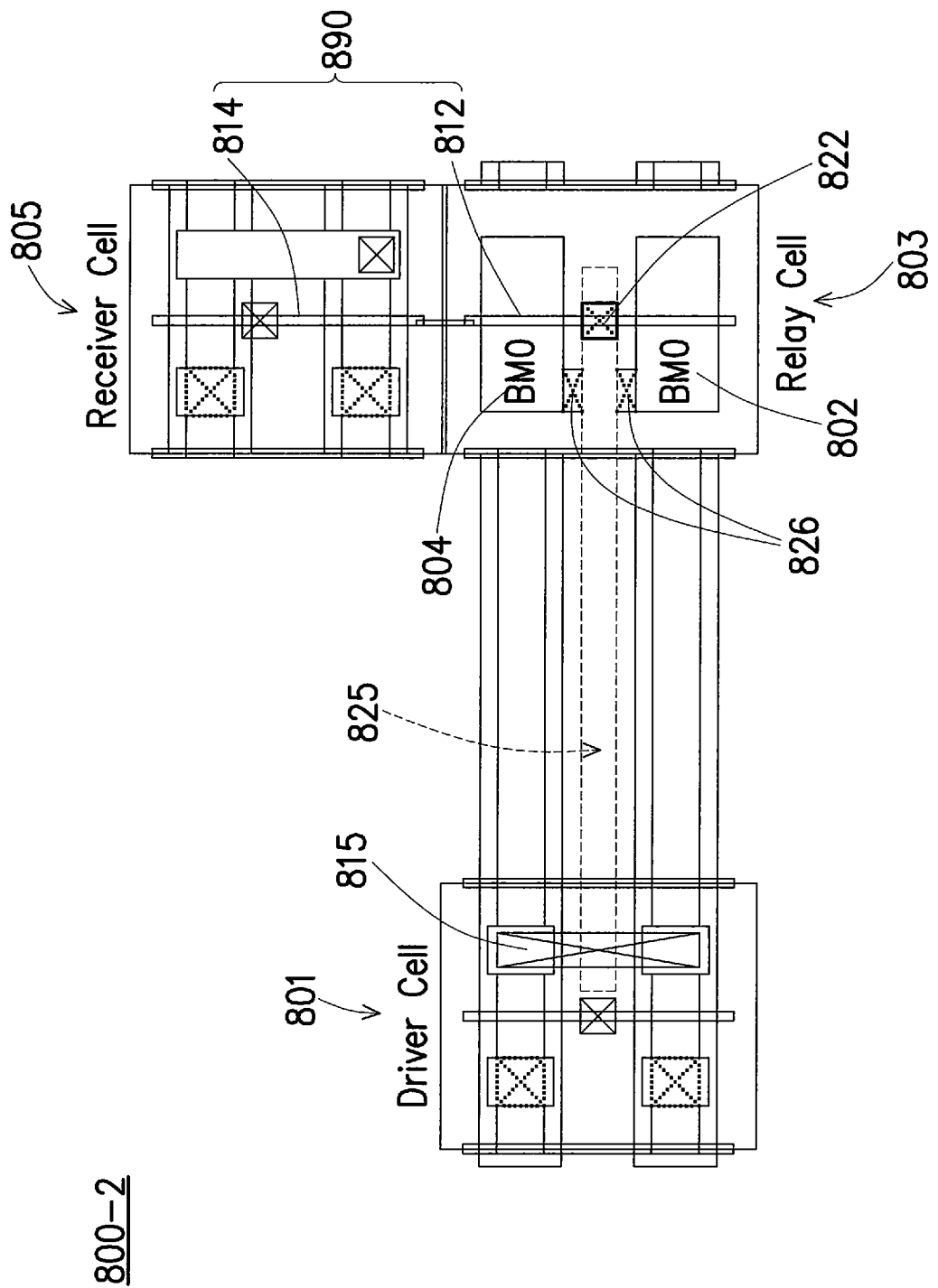
FIG. 8B illustrates a top view of the exemplary back side signal routing in FIG. 8A, in accordance with some embodiments of the present disclosure.

FIG. 8B illustrates a top view 800-2 of the exemplary back side signal routing in FIG. 8A, in accordance with some embodiments of the present disclosure. As shown in FIG. 8A and FIG. 8B, the inner metal 825 extends into both the driver cell 801 and the relay cell 803, to electrically connect the driver cell 801 and the relay cell 803. As such, the data signal can be received by the relay cell 803 through the inner metal 825. In some embodiments, the relay cell 803 may have a structure similar to that of the semiconductor cell structure 100 shown in FIG. 1, the relay cell 600 in FIGS. 6A-6D, and/or the relay cell 700 in FIG. 7.

As shown in FIG. 8A and FIG. 8B, the inner metal 825 in the relay cell 803 may forward the data signal to a middle dummy gate 812 of the relay cell 803, e.g. through a via 822 coupled between the inner metal 825 at the back side of the relay cell 803 and the middle dummy gate 812 at the front side of the relay cell 803. Because the middle dummy gate 812 extends into the receiver cell 805 by connecting to an active gate 814 of the receiver cell 805, the relay cell 803 may forward the data signal to the receiver cell 805 at the back side of the circuit through line extension. The line 890 in FIG. 8B includes two portions: the middle dummy gate 812 in the relay cell 803 and the active gate 814 in the receiver cell 805. Based on the electrical connection between the two portions of the line 890, the relay cell 803 easily relays the data signal to the receiver cell 805 in this example. The receiver cell 805 may utilize the data signal at a transistor at the front side of the receiver cell 805.

In some embodiments, a receiver cell expecting the data signal is not located close to the relay cell 803. In that case, the relay cell 803 may pass the data signal to an additional relay cell that is close to the expecting receiver cell. For example, the relay cell 803 may pass the data signal from the receiver cell 805 to the BM0 lines 802, 804, through the vias 826 located at two respective sides of the inner metal 825, and forward the data signal to the additional relay cell, through: BM1 lines at the back side of the circuit, BM2 lines at the back side of the circuit, and/or an inner metal in the additional relay cell. At least one of the BM1 lines, BM2 lines extends between the additional relay cell and the relay cell 803.

Figure 9:
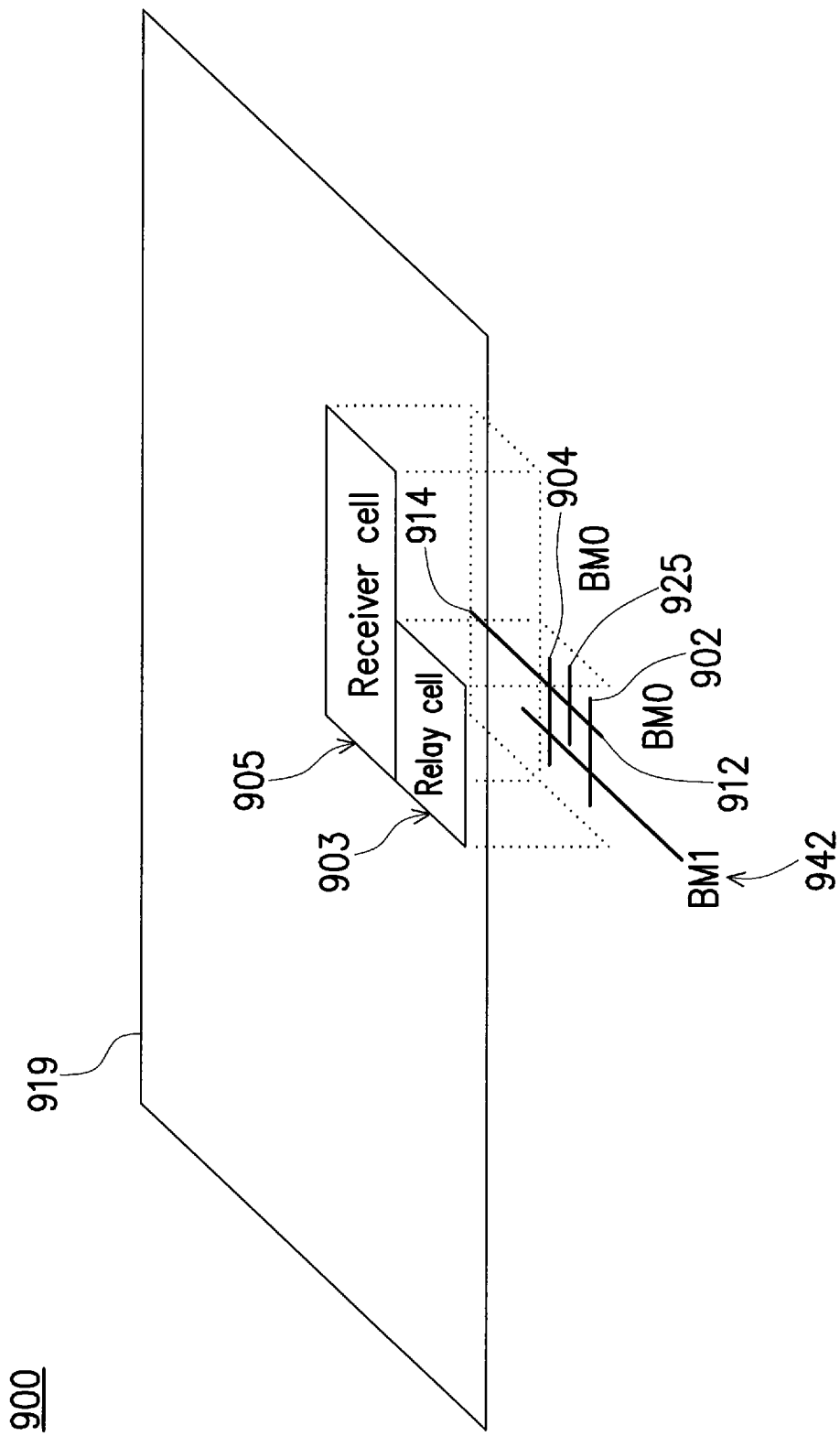
FIG. 9 illustrates a perspective view of another exemplary back side signal routing by a relay cell, in accordance with some embodiments of the present disclosure.

FIG. 9 illustrates a perspective view 900 of another exemplary back side signal routing by a relay cell 903 in a circuit, in accordance with some embodiments of the present disclosure. As shown in FIG. 9, the relay cell 903 may include: a BM1 line 942 at the back side (below the surface 919 in FIG. 9) of the circuit, BM0 lines 902, 904 at the back side of the circuit, an inner metal 925 at the back side of the circuit, and a middle dummy gate 912 at the front side of the circuit.

In some embodiments, the inner metal 925 is configured for receiving a data signal, and forwarding the data signal to the middle dummy gate 912, e.g. through a backside via at the dummy gate. The data signal may be passed through: the BM1 line 942, vias between BM0 and BM1 layers, and the BM0 lines 902, 904. The BM1 line 942 may receive the data signal from another relay cell, or directly from a driver cell that generates the data signal.

The relay cell 903 in FIG. 9 is located next to a receiver cell 905. As such, the middle dummy gate 912 extends into the receiver cell 905 by connecting to an active gate 914 of the receiver cell 905. As such, the middle dummy gate 912 can forward the data signal to the receiver cell 905 through the active gate 914 of the receiver cell 905.

Figure 10:
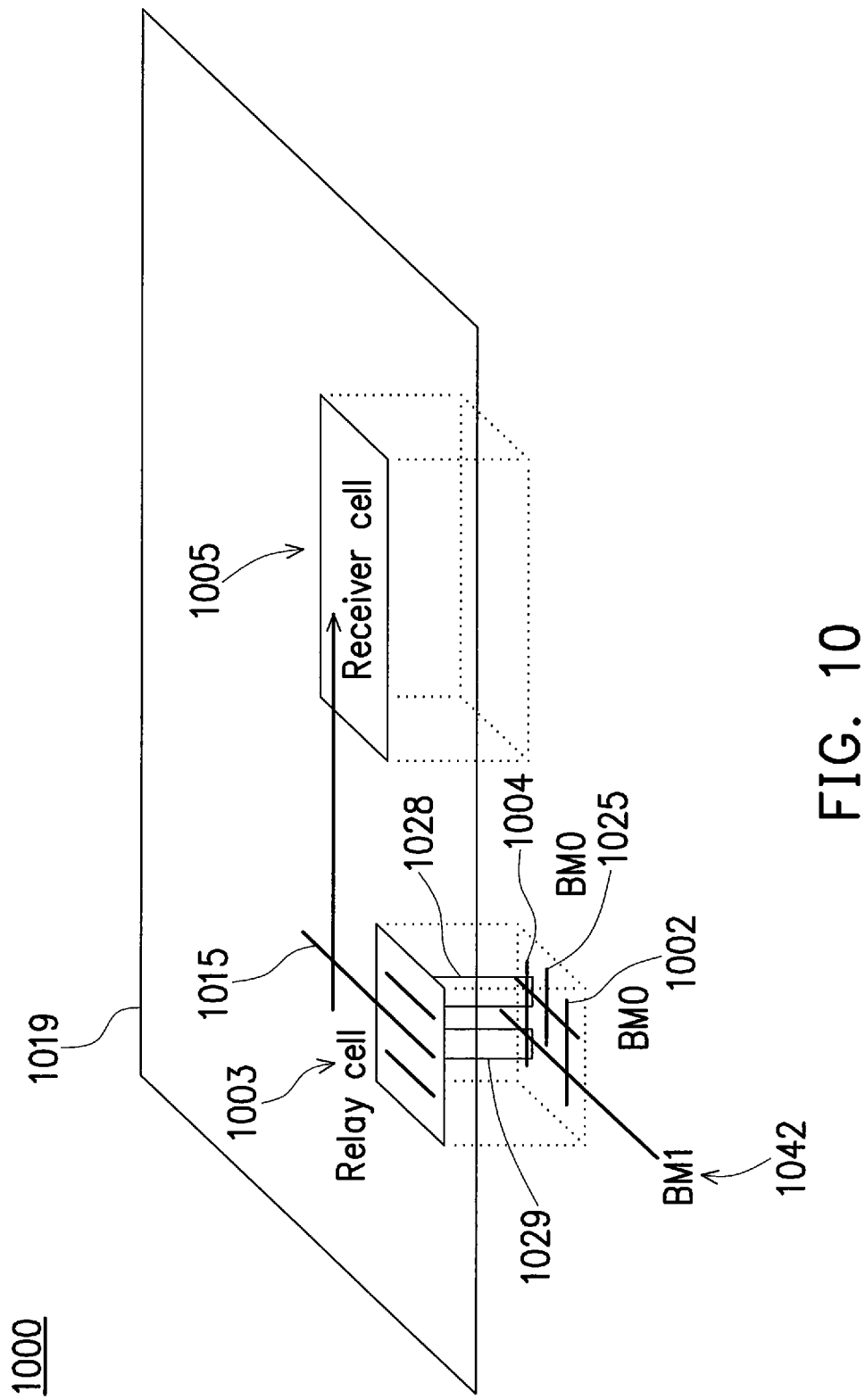
FIG. 10 illustrates a perspective view of yet another exemplary back side signal routing by a relay cell, in accordance with some embodiments of the present disclosure.

FIG. 10 illustrates a perspective view 1000 of yet another exemplary back side signal routing by a relay cell 1003 in a circuit, in accordance with some embodiments of the present disclosure. As shown in FIG. 10, the relay cell 1003 may include: a BM1 line 1042 at the back side (below the surface 1019 in FIG. 10) of the circuit, BM0 lines 1002, 1004 at the back side of the circuit, an inner metal 1025 at the back side of the circuit, feed through vias 1028, 1029 going through the surface 1019, and an epitaxial layer 1015 at the front side of the circuit.

In some embodiments, the relay cell 1003 is configured for receiving a data signal, and forwarding the data signal to a receiver cell 1005. The data signal may be passed through: the BM1 line 1042, vias between BM0 and BM1 layers, and the BM0 lines 1002, 1004. The BM1 line 1042 may receive the data signal from another relay cell, or directly from a driver cell that generates the data signal.

In some embodiments, at least one of the feed through vias 1028, 1029 may physically couple and electrically connect the inner metal 1025 at the back side to the epitaxial layer 1015 at the front side. The inner metal 1025 may be configured for: receiving the data signal from the BM0 lines 1002, 1004, and forwarding the data signal to the epitaxial layer 1015 through one of the feed through vias 1028, 1029. The epitaxial layer 1015 may forward the data signal to the receiver cell 1005 through front side routing. In some embodiments, at least one of the feed through vias 1028, 1029 may physically couple and electrically connect the BM0 lines 1002, 1004 at the back side to the epitaxial layer 1015 at the front side. In some embodiments, at least one of the feed through vias 1028, 1029 may electrically connect the inner metal 1025 at the back side to the epitaxial layer 1015 at the front side, through a dummy gate filled with metal in the relay cell 1003.

Figure 11:
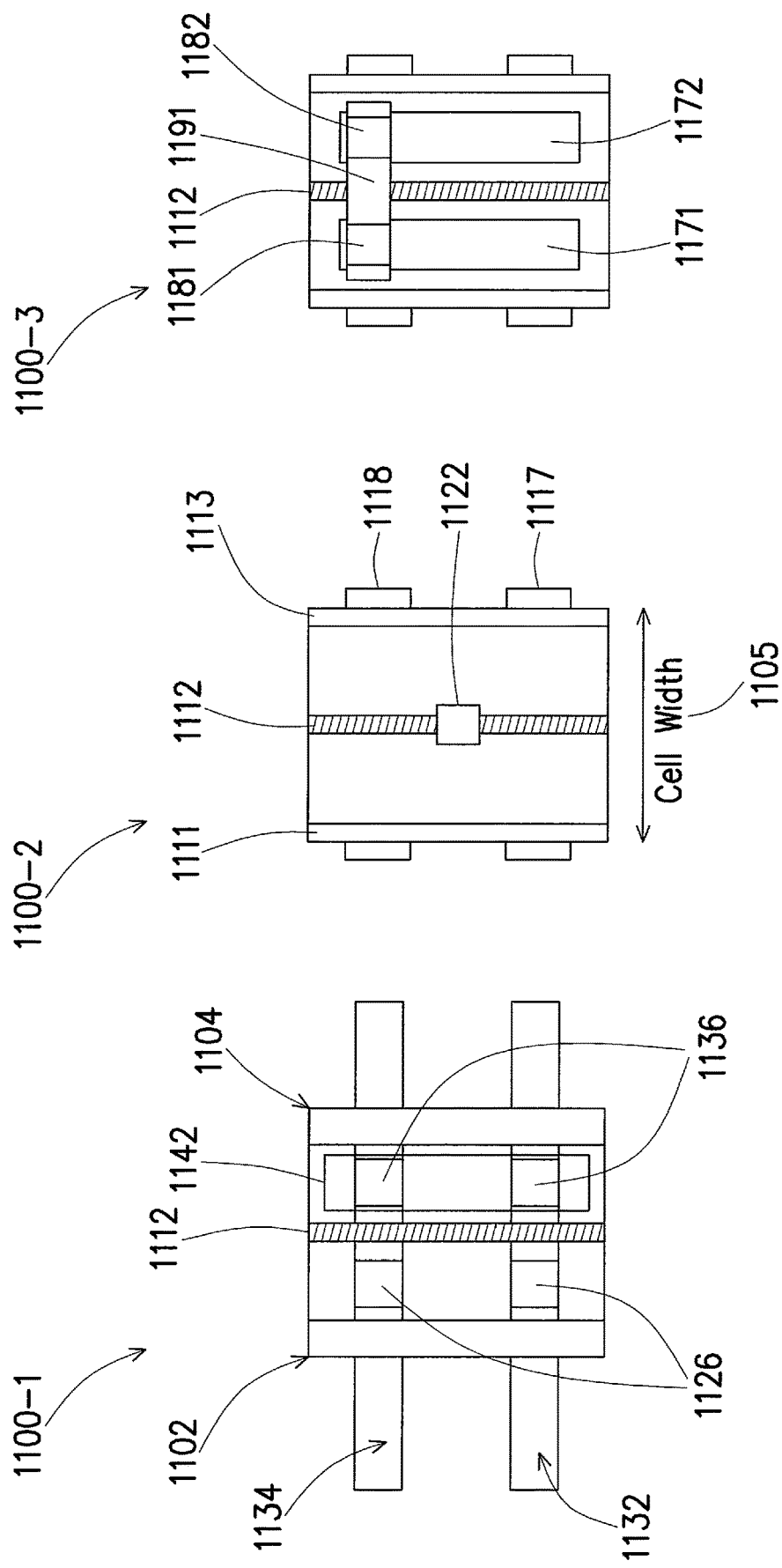
FIGS. 11-14 illustrate exemplary layouts of different relay cells, in accordance with some embodiments of the present disclosure.

FIG. 11 illustrates exemplary layouts of a relay cell 1100, in accordance with some embodiments of the present disclosure. As shown in FIG. 11, the relay cell 1100 has a back side layout 1100-1 similar to that of the relay cell 300 in FIG. 3A; and has a front side layout 1100-2 similar to that of the relay cell 600 in FIG. 6A. In addition, FIG. 11 also shows a detailed front side layout 1100-3 of the relay cell 1100 including: two metal-zero layer over oxide-definition areas ("MOOD" or "MD") areas 1171, 1172 formed between the dummy gates 1111, 1112, 1113; two vias 1181, 1182 at the two MD areas 1171, 1172 respectively; and a metal 0 (M0) line 1191 at the front side. As shown in FIG. 11, the relay cell 1100 has a cell width 1105 equal to two CPPs in this example.

Figure 12:
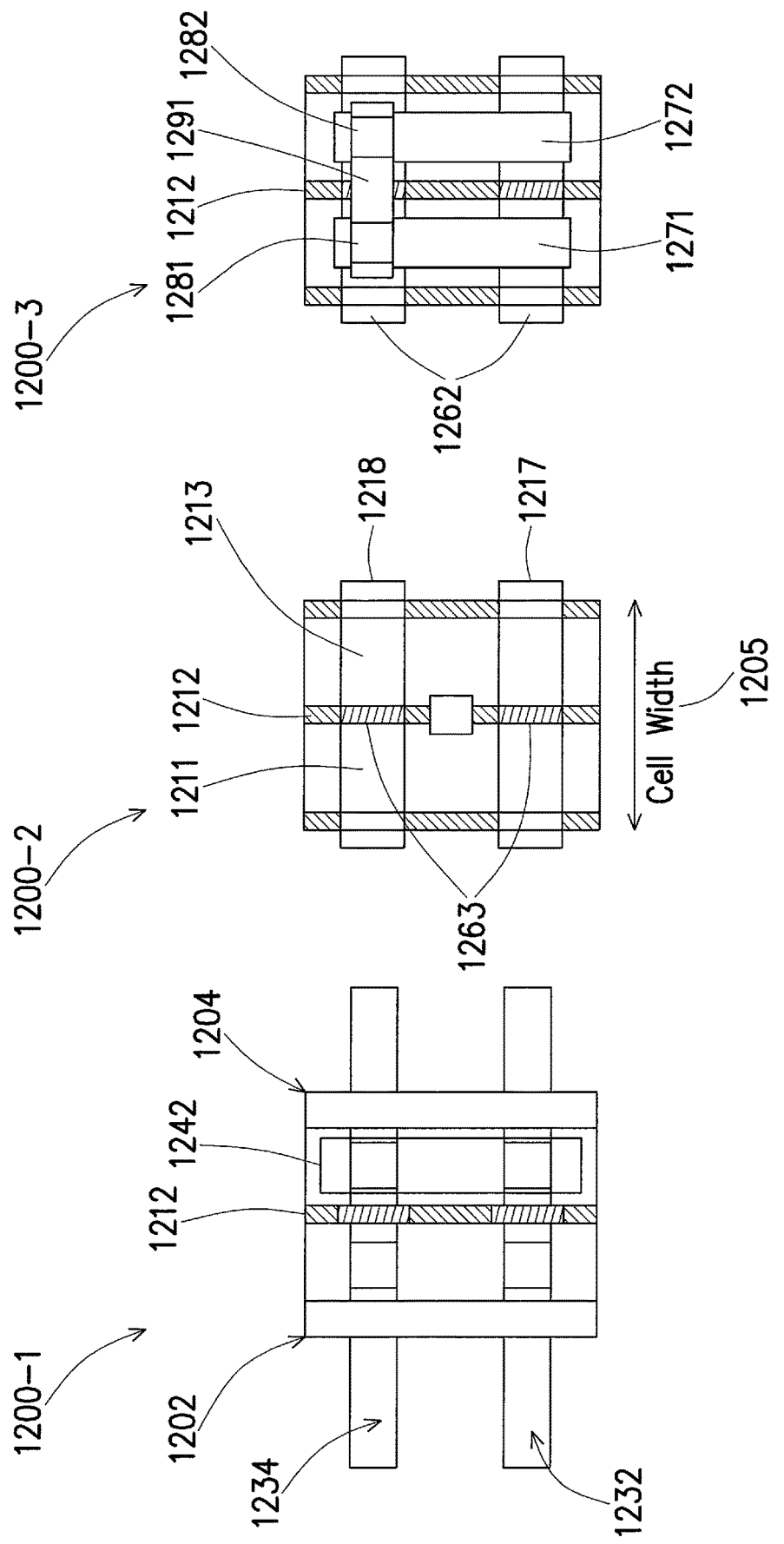

FIG. 12 illustrates exemplary layouts of a relay cell 1200, in accordance with some embodiments of the present disclosure. As shown in FIG. 12, the relay cell 1200 has a back side layout 1200-1 similar to that of the relay cell 300 in FIG. 3A; and has a front side layout 1200-2 similar to that of the relay cell 700 in FIG. 7. In addition, FIG. 12 also shows a detailed front side layout 1200-3 of the relay cell 1200 including: two MD areas 1271, 1272 formed between the dummy gates 1211, 1212, 1213; two vias 1281, 1282 at the two MD areas 1271, 1272 respectively; and a metal 0 (M0) line 1291 at the front side. As shown in FIG. 12, the relay cell 1200 has a cell width 1205 equal to two CPPs in this example.

Figure 13:
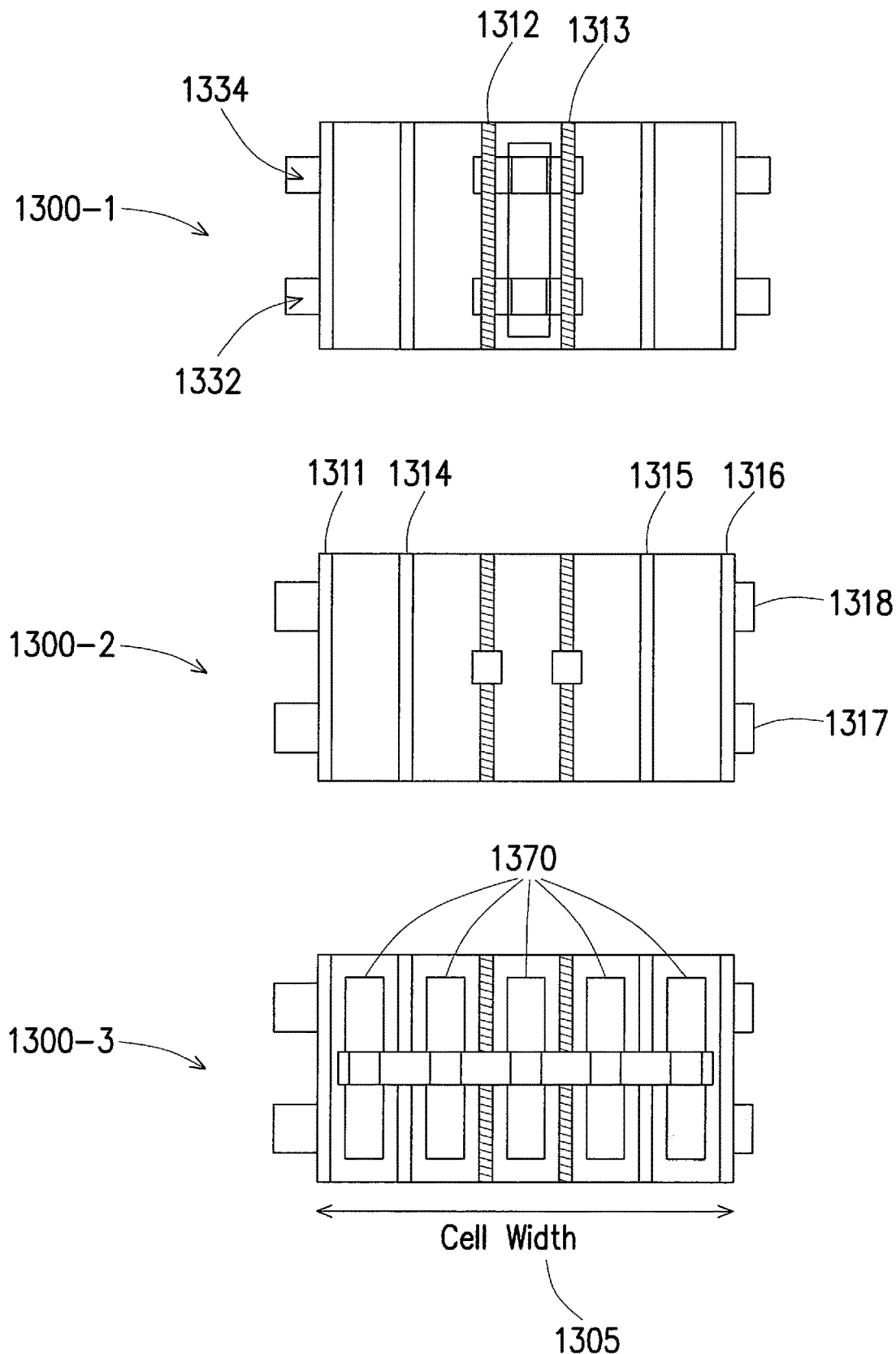

FIG. 13 illustrates exemplary layouts of a relay cell 1300, in accordance with some embodiments of the present disclosure. As shown in FIG. 13, the relay cell 1300 has a back side layout 1300-1 similar to that of the relay cell 400 in FIG. 4; has a front side layout 1300-2 similar to that of the relay cell 600 in FIG. 6A; and has a detailed front side layout 1300-3 including five MD areas 1370 formed between the dummy gates 1311, 1312, 1313, 1314, 1315, 1316. As shown in FIG. 13, the relay cell 1300 has a cell width 1305 equal to five CPPs in this example.

Figure 14:
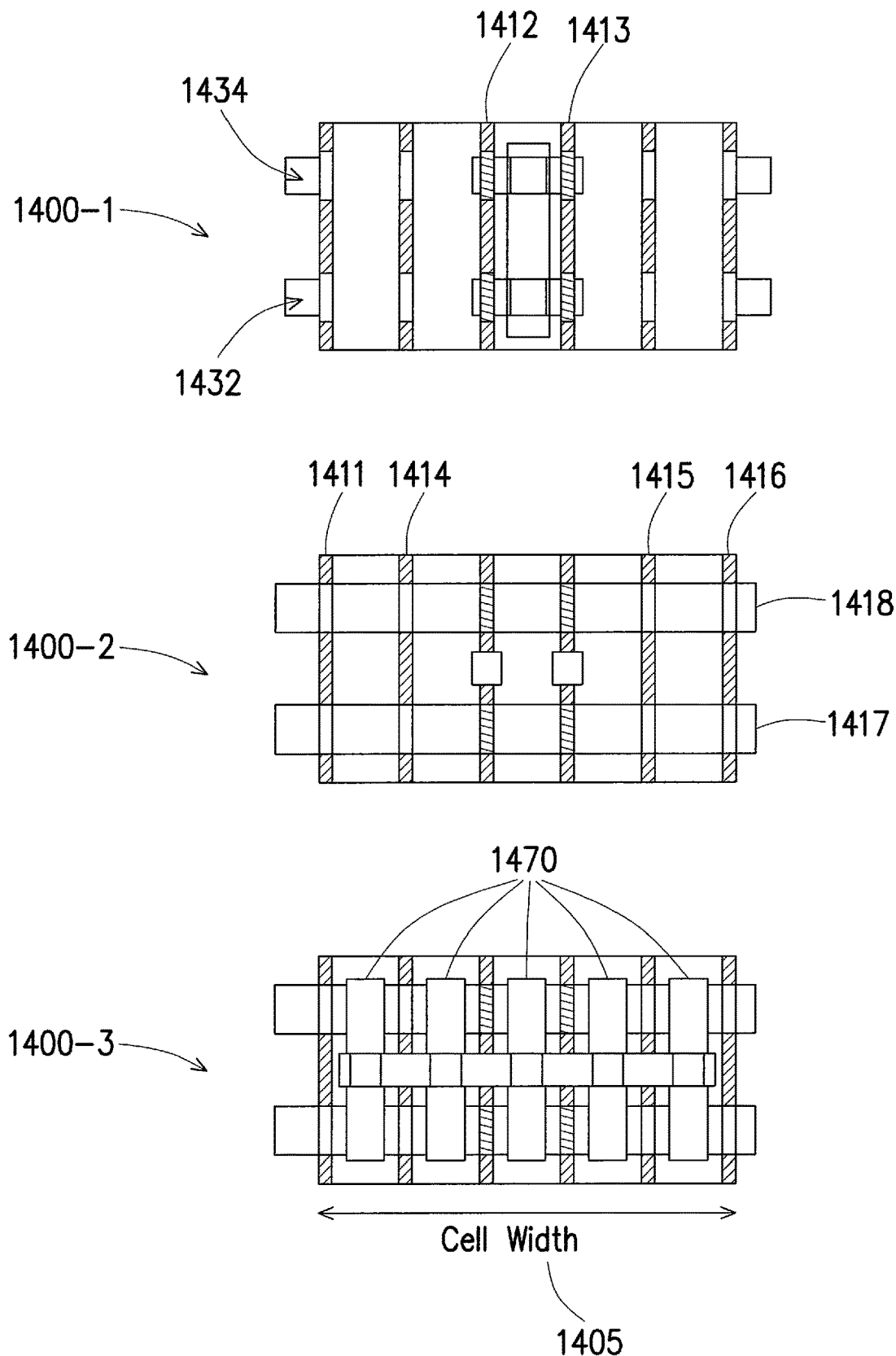

FIG. 14 illustrates exemplary layouts of a relay cell 1400, in accordance with some embodiments of the present disclosure. As shown in FIG. 14, the relay cell 1400 has a back side layout 1400-1 similar to that of the relay cell 400 in FIG. 4; has a front side layout 1400-2 similar to that of the relay cell 700 in FIG. 7; and has a detailed front side layout 1400-3 including five MD areas 1470 formed between the dummy gates 1411, 1412, 1413, 1414, 1415, 1416. As shown in FIG. 14, the relay cell 1400 has a cell width 1405 equal to five CPPs in this example.

Figure 15:
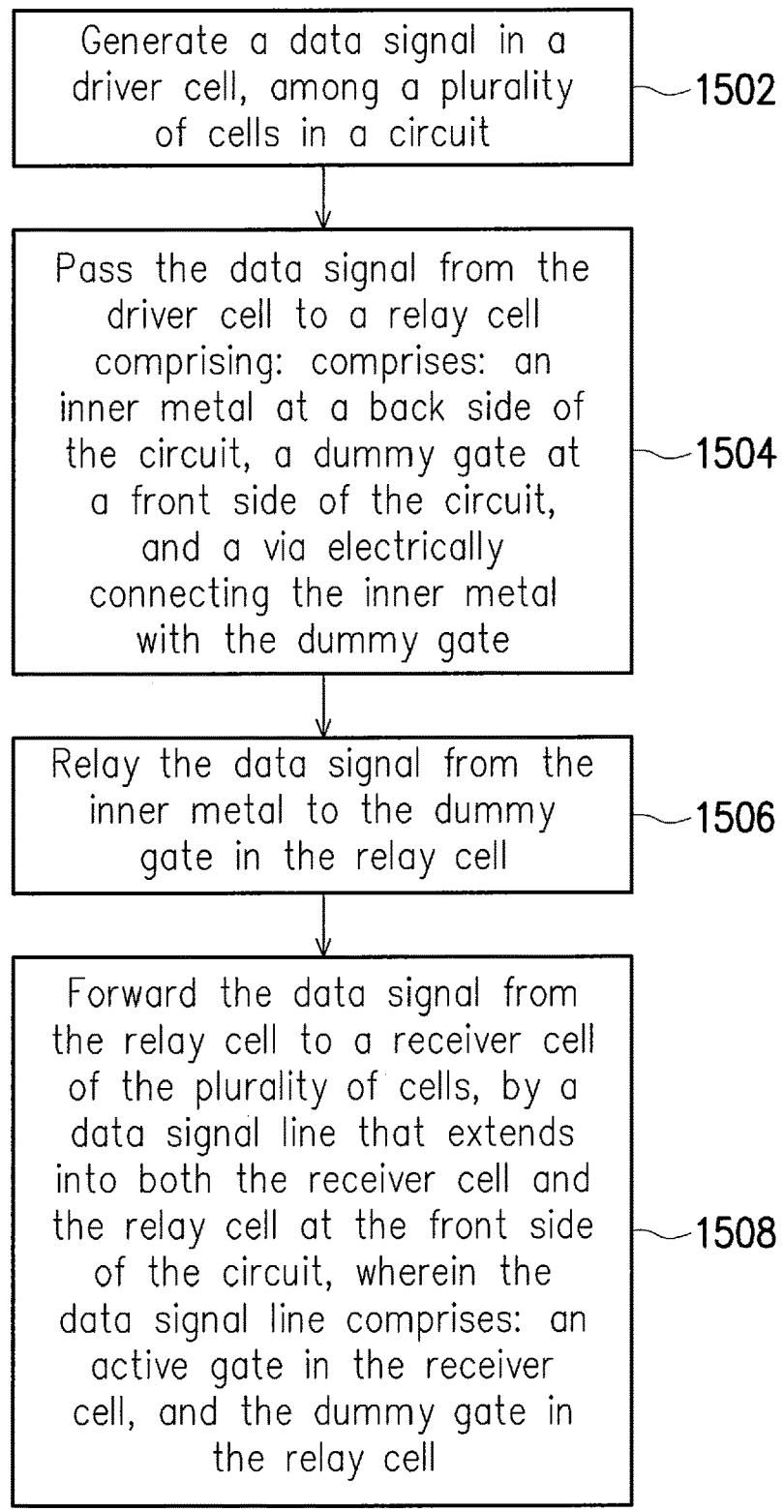
FIG. 15 shows a flow chart illustrating an exemplary method for passing a data signal in a circuit including a plurality of cells, in accordance with some embodiments of the present disclosure.

FIG. 15 shows a flow chart illustrating an exemplary method 1500 for passing a data signal in a circuit including a plurality of cells, in accordance with some embodiments of the present disclosure. In some embodiments, the circuit may be any circuit described in FIGS. 2, 5 and 8-10. At operation 1502, a data signal is generated in a driver cell, among the plurality of cells in the circuit. At operation 1504, the data signal is passed from the driver cell to a relay cell comprising: comprises: an inner metal at a back side of the circuit, a dummy gate at a front side of the circuit, and a via electrically connecting the inner metal with the dummy gate. At operation 1506, the data signal is relayed from the inner metal to the dummy gate in the relay cell. At operation 1508, the data signal is forwarded from the relay cell to a receiver cell of the plurality of cells, by a data signal line that extends into both the receiver cell and the relay cell at the front side of the circuit, wherein the data signal line comprises: an active gate in the receiver cell, and the dummy gate in the relay cell. The order of the operations shown in FIG. 15 may be changed according to different embodiments of the present disclosure.

Figure 16:
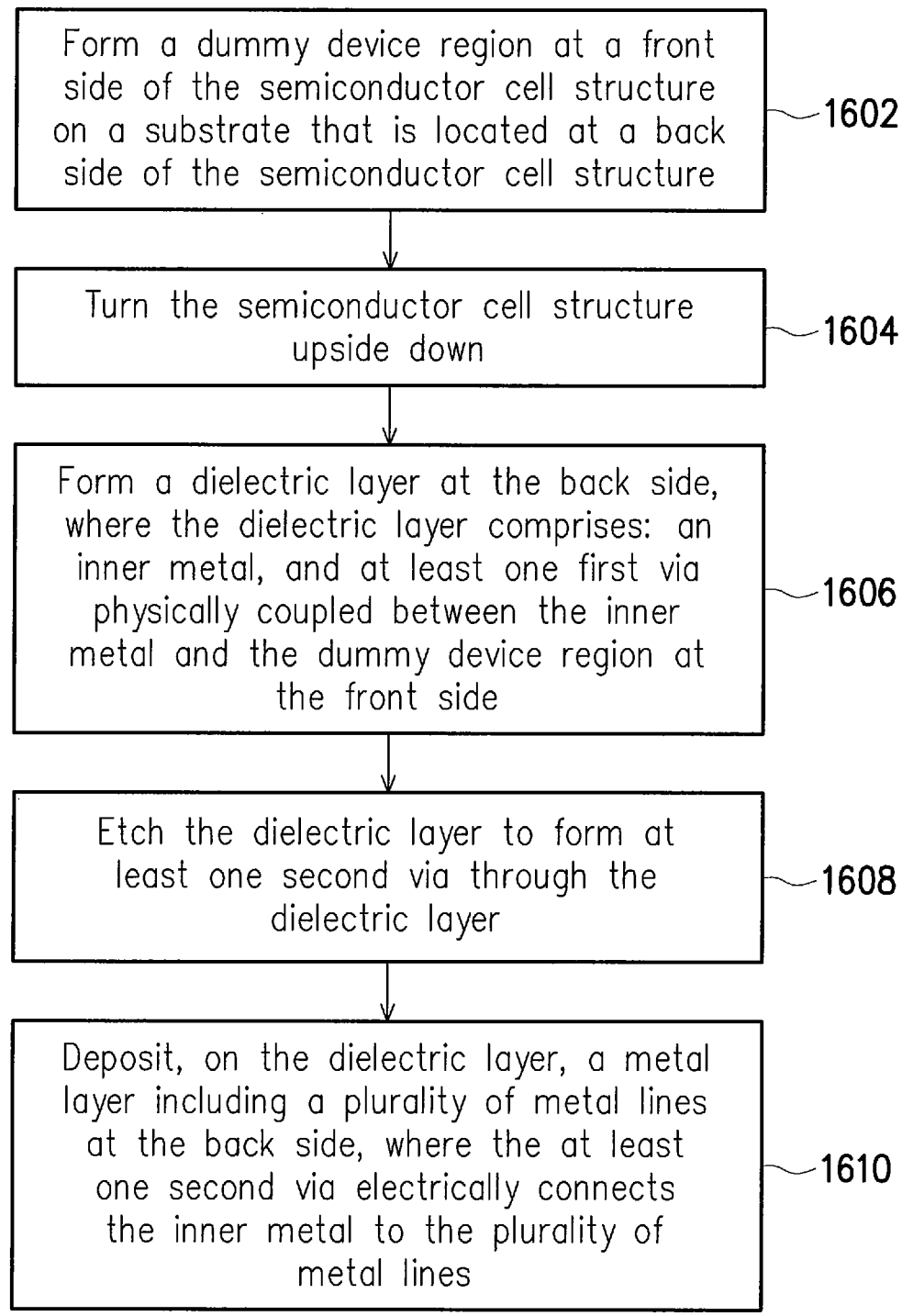
FIG. 16 shows a flow chart illustrating an exemplary method for forming a semiconductor cell structure, in accordance with some embodiments of the present disclosure.

FIG. 16 shows a flow chart illustrating an exemplary method 1600 for forming a semiconductor cell structure, in accordance with some embodiments of the present disclosure. In some embodiments, the semiconductor cell structure may be a structure of any cell described in FIGS. 1-15. At operation 1602, a dummy device region is formed at a front side of the semiconductor cell structure on a substrate that is located at a back side of the semiconductor cell structure. At operation 1604, the semiconductor cell structure is turned upside down. At operation 1606, a dielectric layer is formed at the back side, where the dielectric layer comprises: an inner metal, and at least one first via physically coupled between the inner metal and the dummy device region at the front side. At operation 1608, the dielectric layer is etched to form at least one second via through the dielectric layer. At operation 1610, a metal layer including a plurality of metal lines is deposited at the back side on the dielectric layer, where the at least one second via electrically connects the inner metal to the plurality of metal lines. The order of the operations shown in FIG. 16 may be changed according to different embodiments of the present disclosure.

In an embodiment, a semiconductor cell structure is disclosed. The semiconductor cell structure includes: a dummy device region at a front side of the semiconductor cell structure; a metal layer including a plurality of metal lines at a back side of the semiconductor cell structure; a dielectric layer formed between the dummy device region and the metal layer; an inner metal disposed within the dielectric layer; at least one first via that is formed through the dielectric layer and electrically connects the inner metal to the plurality of metal lines at the back side; and at least one second via that is formed in the dielectric layer and physically coupled between the inner metal and the dummy device region at the front side.

In another embodiment, a semiconductor device is disclosed. The semiconductor device includes: a driver cell configured for generating a signal; a receiver cell configured for receiving the signal; and a relay cell that is located next to the receiver cell, and is configured for relaying the signal from the driver cell to the receiver cell through a signal line that extends into both the receiver cell and the relay cell. The signal line comprises an active gate in the receiver cell at a front side of the semiconductor device. The signal line comprises a dummy gate in the relay cell at the front side of the semiconductor device. The relay cell comprises an inner metal that is disposed at a back side of the semiconductor device and configured for receiving the signal from the driver cell. The relay cell comprises a via that electrically connects the inner metal to the dummy gate to forward the signal to the receiver cell by the signal line.

In yet another embodiment, a method for passing a data signal in a circuit including a plurality of cells is disclosed. The method includes: generating the data signal in a driver cell of the plurality of cells; passing the data signal from the driver cell to a relay cell of the plurality of cells, wherein the relay cell comprises: an inner metal at a back side of the circuit, a dummy gate at a front side of the circuit, and a via electrically connecting the inner metal with the dummy gate; relaying the data signal from the inner metal to the dummy gate in the relay cell; and forwarding the data signal from the relay cell to a receiver cell of the plurality of cells, by a data signal line that extends into both the receiver cell and the relay cell at the front side of the circuit, wherein the data signal line comprises: an active gate in the receiver cell, and the dummy gate in the relay cell.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor cell structure, comprising:
   a dummy device region at a front side of the semiconductor cell structure;
   a metal layer including a plurality of metal lines at a back side of the semiconductor cell structure;
   a dielectric layer formed between the dummy device region and the metal layer;
   an inner metal disposed within the dielectric layer;
   at least one first via that is formed through the dielectric layer and electrically connects the inner metal to the plurality of metal lines at the back side; and
   at least one second via that is formed in the dielectric layer and physically coupled between the inner metal and the dummy device region at the front side,
   wherein the inner metal electrically connects the semiconductor cell structure with a driver cell and is configured for:
      receiving a signal from the driver cell; and
      forwarding the signal to a receiver cell at the back side through: the at least one first via, the metal layer, and an inner metal of the receiver cell.

2. The semiconductor cell structure of claim 1, wherein:
   the at least one first via comprises two first vias disposed respectively at two sides of the inner metal along a first direction; and
   each of the two first vias extends through the dielectric layer along a second direction that is perpendicular to the first direction.

3. The semiconductor cell structure of claim 2, further comprising:
   two dielectric regions disposed respectively at two boundaries of the semiconductor cell structure along a third direction that is perpendicular to the first direction and the second direction.

4. The semiconductor cell structure of claim 3, wherein:
   the plurality of metal lines comprise metal 0 lines that are electrically isolated by the two dielectric regions from metal 0 lines outside the semiconductor cell structure;
   the semiconductor cell structure has a cell width along the third direction; and
   the cell width is equal to at least two contacted poly pitches.

5. The semiconductor cell structure of claim 2, further comprising:
   two empty space regions disposed respectively at two boundaries of the semiconductor cell structure along a third direction that is perpendicular to the first direction and the second direction.

6. The semiconductor cell structure of claim 5, wherein:
the plurality of metal lines comprise metal 0 lines that are electrically isolated by the two empty space regions from metal 0 lines outside the semiconductor cell structure;
the semiconductor cell structure has a cell width along the third direction; and
the cell width is equal to at least a sum of: a minimum length of a metal 0 line plus twice an end-to-end space distance.

7. The semiconductor cell structure of claim 2, wherein the dummy device region comprises:
two boundary dummy gates located respectively at two boundaries of the semiconductor cell structure along a third direction that is perpendicular to the first direction and the second direction; and
a middle dummy gate located between the two boundary dummy gates along the third direction.

8. The semiconductor cell structure of claim 7, wherein:
the middle dummy gate comprises a metal material;
the at least one second via extends along the second direction to electrically connect the inner metal with the middle dummy gate; and
each of the two boundary dummy gates comprises at least one of: a dielectric material or a polysilicon.

9. The semiconductor cell structure of claim 8, wherein:
the dummy device region further comprises at least one active zone isolated from active zones outside the semiconductor cell structure by the two boundary dummy gates.

10. The semiconductor cell structure of claim 8, wherein:
the inner metal electrically connects the semiconductor cell structure with a driver cell, and is configured for:
receiving a signal from the driver cell, and
forwarding the signal to the middle dummy gate; and
the middle dummy gate extends into a receiver cell by connecting to an active gate of the receiver cell, and is configured for:
forwarding the signal to the receiver cell through the active gate of the receiver cell.

11. The semiconductor cell structure of claim 8, wherein:
the inner metal is configured for:
receiving a signal from a driver cell through: the metal layer and the at least one first via, and
forwarding the signal to the middle dummy gate; and
the middle dummy gate extends into a receiver cell by connecting to an active gate of the receiver cell, and is configured for:
forwarding the signal to the receiver cell through the active gate of the receiver cell.

12. A semiconductor cell structure, comprising:
a dummy device region at a front side of the semiconductor cell structure;
a metal layer including a plurality of metal lines at a back side of the semiconductor cell structure;
a dielectric layer formed between the dummy device region and the metal layer;
an inner metal disposed within the dielectric layer;
at least one first via that is formed through the dielectric layer and electrically connects the inner metal to the plurality of metal lines at the back side; and
at least one second via that is formed in the dielectric layer and physically coupled between the inner metal and the dummy device region at the front side,
wherein the at least one first via comprises two first vias disposed respectively at two sides of the inner metal along a first direction, and each of the two first vias extends through the dielectric layer along a second direction that is perpendicular to the first direction.

13. The semiconductor cell structure of claim 12, further comprising:
two empty space regions disposed respectively at two boundaries of the semiconductor cell structure along a third direction that is perpendicular to the first direction and the second direction.

14. The semiconductor cell structure of claim 12, further comprising:
two dielectric regions disposed respectively at two boundaries of the semiconductor cell structure along a third direction that is perpendicular to the first direction and the second direction.

15. The semiconductor cell structure of claim 14, wherein:
the plurality of metal lines comprise metal 0 lines that are electrically isolated by the two dielectric regions from metal 0 lines outside the semiconductor cell structure;
the semiconductor cell structure has a cell width along the third direction; and
the cell width is equal to at least two contacted poly pitches.

16. A semiconductor cell structure, comprising:
a dummy device region at a front side of the semiconductor cell structure;
a metal layer including a plurality of metal lines at a back side of the semiconductor cell structure;
a dielectric layer formed between the dummy device region and the metal layer;
an inner metal disposed within the dielectric layer;
at least one first via that is formed through the dielectric layer and electrically connects the inner metal to the plurality of metal lines at the back side;
at least one second via that is formed in the dielectric layer and physically coupled between the inner metal and the dummy device region at the front side;
an epitaxial layer at the front side; and
a feed through via that physically couples and electrically connects the inner metal at the back side to the epitaxial layer at the front side, wherein:
the inner metal is configured for: receiving a signal from a driver cell through the metal layer and the at least one first via, and forwarding the signal to the epitaxial layer through the feed through via, and
the epitaxial layer is configured for forwarding the signal to a receiver cell through front side routing.

17. The semiconductor cell structure of claim 16, wherein:
the at least one first via comprises two first vias disposed respectively at two sides of the inner metal along a first direction; and
each of the two first vias extends through the dielectric layer along a second direction that is perpendicular to the first direction.

18. The semiconductor cell structure of claim 17, further comprising:
two dielectric regions disposed respectively at two boundaries of the semiconductor cell structure along a third direction that is perpendicular to the first direction and the second direction.

19. The semiconductor cell structure of claim 17, wherein the dummy device region comprises:
two boundary dummy gates located respectively at two boundaries of the semiconductor cell structure along a third direction that is perpendicular to the first direction and the second direction; and a middle dummy gate located between the two boundary dummy gates along the third direction.

20. The semiconductor cell structure of claim 19, wherein:
the middle dummy gate comprises a metal material;
the at least one second via extends along the second direction to electrically connect the inner metal with the middle dummy gate; and
each of the two boundary dummy gates comprises at least one of: a dielectric material or a polysilicon.

* * * * *